United States Patent
Her et al.

(10) Patent No.: US 9,373,662 B2
(45) Date of Patent: Jun. 21, 2016

(54) DISPLAY PANEL FOR COMPENSATING NEGATIVE POWER SUPPLY VOLTAGE, DISPLAY MODULE AND MOBILE DEVICE INCLUDING THE SAME

(71) Applicant: Samsung Display Co., Ltd., Yongin, Gyeonggi-Do (KR)

(72) Inventors: Yong-Koo Her, Yongin-si (KR); Mu-Kyung Jeon, Ulsan (KR); Hee-Rim Song, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/683,094

(22) Filed: Apr. 9, 2015

(65) Prior Publication Data
US 2016/0126287 A1    May 5, 2016

(30) Foreign Application Priority Data
Oct. 29, 2014   (KR) ........................ 10-2014-0147845

(51) Int. Cl.
| | |
|---|---|
| *H01L 29/18* | (2006.01) |
| *H01L 33/00* | (2010.01) |
| *H01L 27/15* | (2006.01) |
| *H01L 51/50* | (2006.01) |
| *H01L 51/52* | (2006.01) |
| *H01L 27/32* | (2006.01) |
| *H01L 27/12* | (2006.01) |

(52) U.S. Cl.
CPC ............ *H01L 27/156* (2013.01); *H01L 27/124* (2013.01); *H01L 27/3276* (2013.01); *H01L 51/5012* (2013.01); *H01L 51/5225* (2013.01)

(58) Field of Classification Search
CPC ............ H01L 27/3276; H01L 51/5225; H01L 51/5012; H01L 27/124; H01L 27/156; H01L 27/3297; H01L 27/3246; H01L 51/52; H01L 51/5203
See application file for complete search history.

(56) References Cited

U.S. PATENT DOCUMENTS

| | | | | |
|---|---|---|---|---|
| 9,224,332 B2 * | 12/2015 | Byun | ................... | G09G 3/3233 |
| 2004/0256620 A1 | 12/2004 | Yamazaki et al. | | |
| 2009/0206770 A1 * | 8/2009 | Hong | ................... | G09G 3/3233 315/291 |
| 2014/0061652 A1 | 3/2014 | Park et al. | | |

FOREIGN PATENT DOCUMENTS

| | | |
|---|---|---|
| KR | 10-2012-0010824 A | 2/2012 |
| KR | 10-2013-0060934 A | 6/2013 |
| KR | 10-2014-0033834 A | 3/2014 |

OTHER PUBLICATIONS

EPO Search Report dated Apr. 4, 2016, for corresponding European Patent application 15170750.2, (10 pages).

* cited by examiner

*Primary Examiner* — Thanh Y Tran
(74) *Attorney, Agent, or Firm* — Lewis Roca Rothgerber Christie LLP

(57) ABSTRACT

A display panel including: a cathode electrode formed in a cathode region of the display panel, the cathode electrode entirely covering an active region of the display panel a plurality of pixel units in columns and rows in the active region of the display panel; a ring-shaped edge negative voltage line formed in a ring-shaped edge portion of the cathode electrode configured to supply a negative power supply voltage to the cathode electrode; and a plurality of compensation negative voltage lines connected to the ring-shaped edge negative voltage line, the compensation negative voltage lines extending along a column direction of the display panel and arranged along a row direction of the display panel.

20 Claims, 23 Drawing Sheets

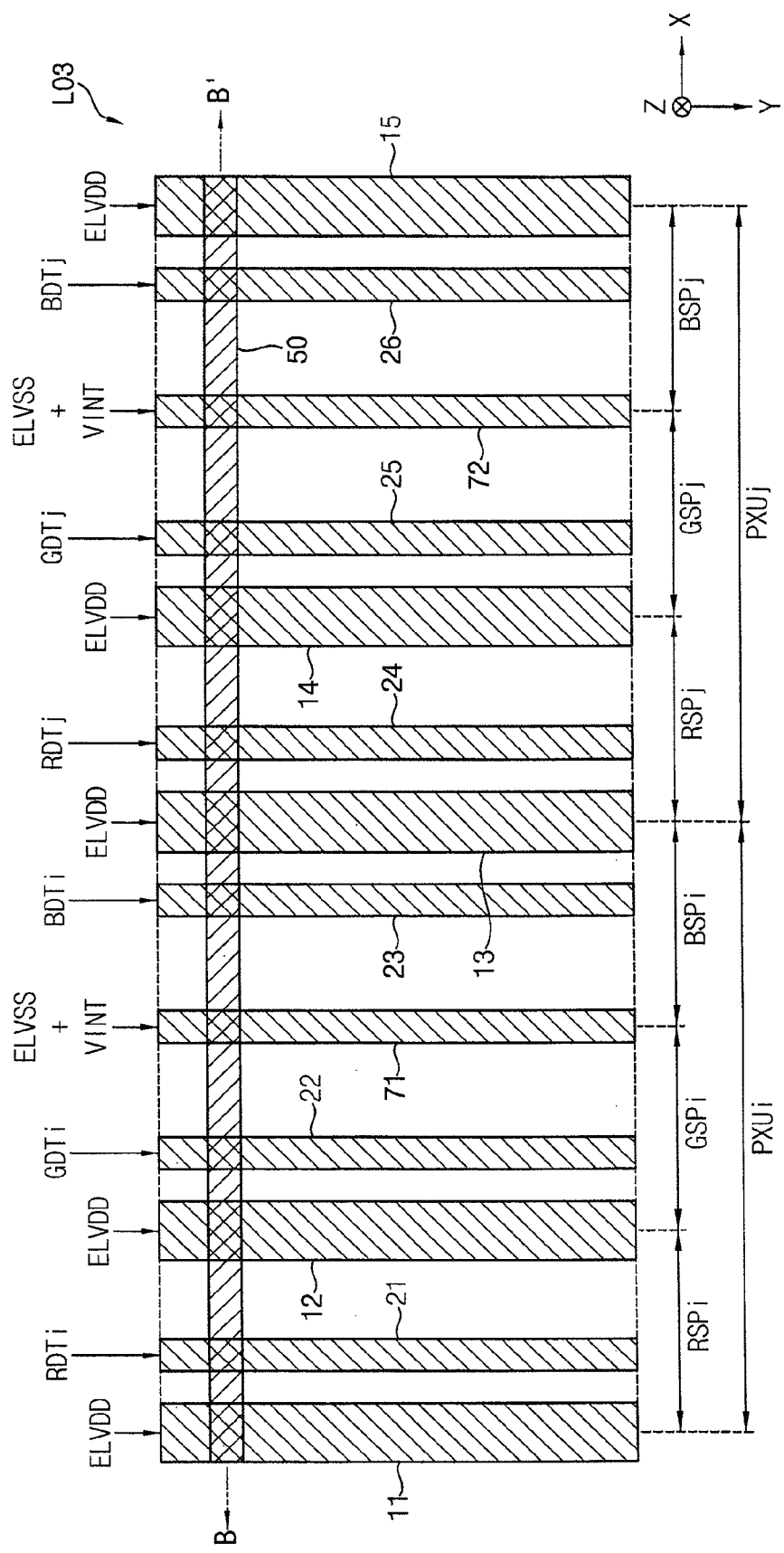

DISPLAY PANEL FOR COMPENSATING NEGATIVE POWER SUPPLY VOLTAGE, DISPLAY MODULE AND MOBILE DEVICE INCLUDING THE SAME

CROSS REFERENCE TO RELATED APPLICATION

This application claims priority to and the benefit of Korean Patent Application No. 10-2014-0147845 filed on Oct. 29, 2014, in the Korean Intellectual Property Office (KIPO), the disclosure of which is hereby incorporated by reference herein in its entirety.

BACKGROUND

1. Field

Aspects of embodiments of the present invention relate to a display, and more particularly to a display panel configured to compensate for a negative power supply voltage, a display module and a mobile device including the display panel.

2. Discussion of the Related Art

Recently, various display devices such as liquid crystal displays (LCD), plasma displays, and electroluminescent displays have gained popularity. Among these displays, electroluminescent displays can be driven with quick response speed and reduced power consumption, using a light-emitting diode (LED) or an organic light-emitting diode (OLED) that emits light through the recombination of electrons and holes. The luminance of an electroluminescent display device is determined (or controlled) by a global driving current that is the sum of respective pixel driving currents. In other words, the higher global driving current is supplied (e.g., required) when the displayed image has a higher brightness.

As the ohmic drop (or the IR drop) along the power voltage lines decreases, the quality of the displayed image may be enhanced and the power consumption may be reduced. To decrease the ohmic drop, the cross-sectional area of the power voltage lines may be increased. However, the increase of the cross-sectional area is restricted by limitations of design margins because the various signal and voltage lines such as the power voltage lines, the data lines, the gate lines, the initial voltage lines, etc. are integrated in the display panel.

SUMMARY

At least one aspect of an embodiment of the present invention provides a display device capable of compensating a negative power supply voltage.

At least one aspect of an embodiment of the present invention provides a display module including a display device capable of compensating a negative power supply voltage.

At least one aspect of an embodiment of the present invention provides a mobile device including a display device capable of compensating a negative power supply voltage.

According to one embodiment, a display panel includes: a cathode electrode formed in a cathode region of the display panel, the cathode electrode entirely covering an active region of the display panel a plurality of pixel units in columns and rows in the active region of the display panel; a ring-shaped edge negative voltage line formed in a ring-shaped edge portion of the cathode electrode configured to supply a negative power supply voltage to the cathode electrode; and a plurality of compensation negative voltage lines connected to the ring-shaped edge negative voltage line, the compensation negative voltage lines extending along a column direction of the display panel and arranged along a row direction of the display panel.

The display panel may further include a plurality of positive voltage lines and a plurality of initialization voltage lines. The positive voltage lines may be formed in a first metal layer and may be configured to provide a positive power supply voltage to the pixel units, and the positive voltage lines may extend along the column direction and be arranged along the row direction. The display panel may further include a plurality initialization voltage lines formed in the first metal layer and configured to provide an initialization voltage to the pixel units. The initialization voltage lines may extend along the column direction and may be arranged along the row direction.

The compensation negative voltage lines may be formed in the first metal layer through the same manufacturing processes as the manufacturing processes of the positive voltage lines and the initialization voltage lines.

The initialization voltage lines may include one initialization voltage line per two columns of pixel units and the compensation negative voltage lines may include one compensation negative voltage line per two columns of pixel units.

The compensation negative voltage lines may be formed in a second metal layer over the first metal layer through manufacturing processes separate from manufacturing processes of the positive voltage lines and the initialization voltage lines.

The compensation negative voltage lines may include two compensation negative voltage lines per column of pixel units, and the initialization voltage lines may include one initialization voltage line per column of pixel units.

Each of the compensation negative voltage lines may be over corresponding ones of the positive voltage lines such that the two compensation negative voltage lines may be arranged per one column of pixel units.

Each of the compensation negative voltage lines may be over corresponding ones of the initialization voltage lines such that one compensation negative voltage lines may be arranged per one column of pixel units.

Each of the compensation negative voltage lines may be over each of the positive voltage lines and each of the initialization voltage lines such that three compensation negative voltage fines may be arranged per one column of pixel units.

The compensation negative voltage lines may be formed in an anode layer over the first metal layer through a manufacturing processes different from manufacturing processes of the positive voltage lines and the initialization voltage lines, where anode electrodes of light-emitting diodes in the pixel units are formed in the anode layer.

The display panel may further include a plurality of positive voltage lines formed in a first metal layer configured to provide a positive power supply voltage to the pixel units, the positive voltage lines extending along the column direction and arranged along the row direction, the positive voltage lines being formed through the same manufacturing process as the compensation negative voltage lines, wherein the compensation negative voltage lines are further configured to supply an initialization voltage to the pixel units, the initialization voltage having a voltage equal to the negative power supply voltage.

Each of the compensation negative voltage lines may be coupled to pixel units of a corresponding one of the columns.

The ring-shaped edge negative voltage line and the compensation negative voltage lines may be formed in a same metal layer.

The ring-shaped edge negative voltage line and the compensation negative voltage lines may be patterned through the same manufacturing processes and may be directly connected to each other.

The ring-shaped edge negative voltage line and the compensation negative voltage lines may be formed in different metal layers.

The ring-shaped edge negative voltage line and the compensation negative voltage lines may be connected to each other through a plurality of vertical contacts.

The ring-shaped edge negative voltage line may include a top edge line along a top edge portion of the cathode electrode, the top edge line extending along the row direction, a bottom edge line along a bottom edge portion of the cathode electrode, the bottom edge line extending along the row direction, a left edge line along a left edge portion of the cathode electrode, the left edge line extending along the column direction and a right edge line along a right edge portion of the cathode electrode, the right edge line extending along the column direction.

The compensation negative voltage lines extending along the column direction may be connected to the top edge line and the bottom edge line extending along the row direction.

According to one embodiment, a display module includes a display panel and a driving circuit configured to drive the display panel. The display panel includes a cathode electrode, a ring-shaped edge negative voltage line, and a plurality of compensation negative voltage lines. The cathode electrode is in a cathode region of the display panel, and the cathode electrode covers an entire active region in which a plurality of pixel units are located. The ring-shaped edge negative voltage line is in a ring-shaped edge portion of the cathode electrode configured to apply a negative power supply voltage to the cathode electrode. The compensation negative voltage lines are connected to the ring-shaped edge negative voltage line. The compensation negative voltage lines extend along a column direction and arranged along a row direction.

According to one embodiment, a mobile device includes an application processor, a display panel, and a driving circuit configured to be controlled by the application processor to drive the display panel. The display panel includes a cathode electrode, a ring-shaped edge negative voltage line, and a plurality of compensation negative voltage lines. The cathode electrode is formed in a cathode region of the display panel, and the cathode electrode covers an entire active region in which a plurality of pixel units are located. The ring-shaped edge negative voltage line is formed in a ring-shaped edge portion of the cathode electrode configured to apply a negative power supply voltage to the cathode electrode. The compensation negative voltage lines are connected to the ring-shaped edge negative voltage line. The compensation negative voltage lines extending along a column direction and arranged along a row direction.

The display panel, the display module, and the mobile device including the display panel may reduce (or efficiently reduce) the ohmic drop of the negative power supply voltage using the compensation negative voltage lines and thus the power consumption may be reduced without changing the established manufacturing processes excessively.

BRIEF DESCRIPTION OF THE DRAWINGS

Example embodiments of the present invention will be more clearly understood from the following detailed description taken in conjunction with the accompanying drawings.

FIGS. 11A and 11B are diagrams illustrating a layout of voltage lines according to still another example embodiment of the present invention.

DETAILED DESCRIPTION

Figure 1:
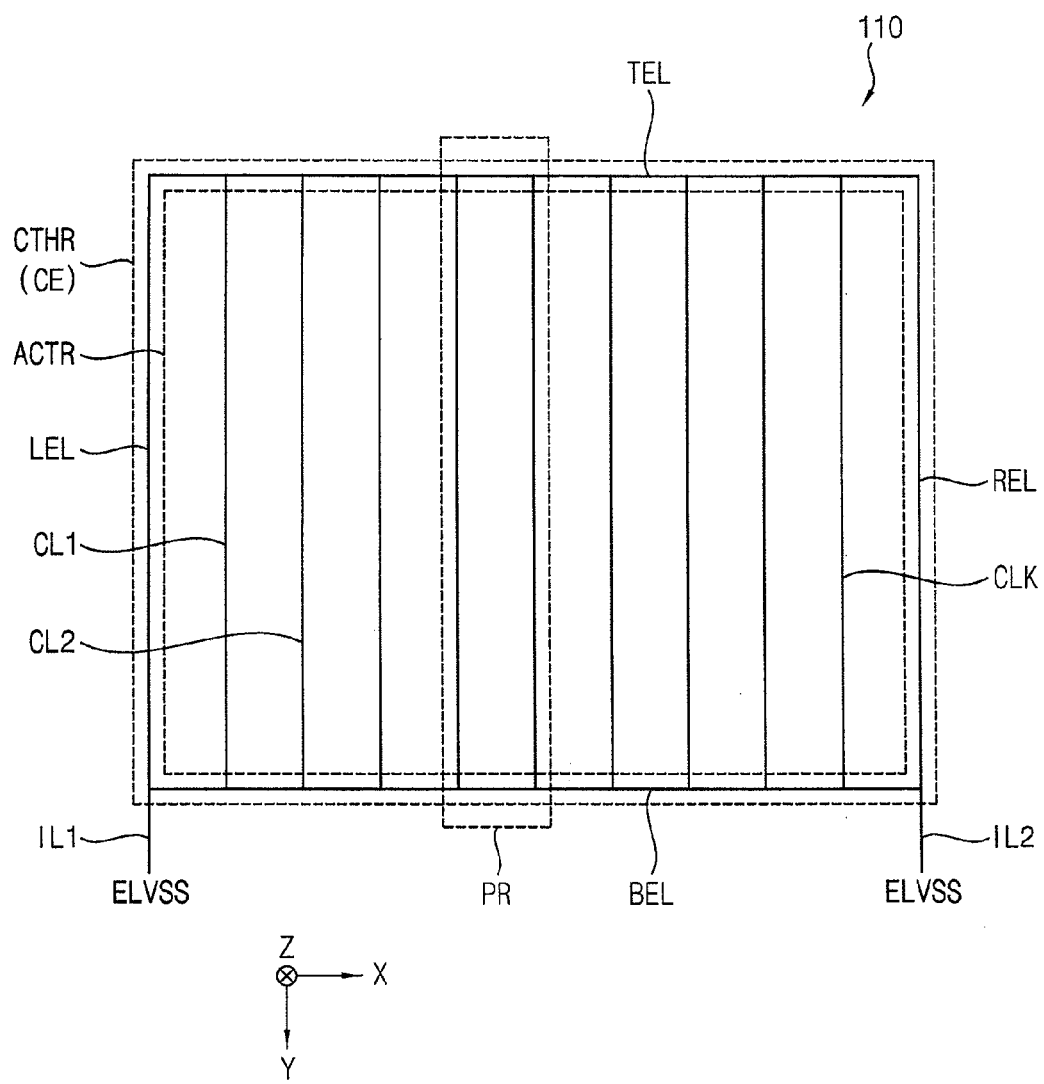
FIG. 1 is a diagram illustrating a layout of negative voltage lines in a display panel according to example embodiments of the present invention.

The example embodiments are described more fully hereinafter with reference to the accompanying drawings. Like or similar reference numerals refer to like or similar elements throughout.

FIG. 1 is a diagram illustrating a layout of negative voltage lines in a display panel according to example embodiments of the present invention.

Referring to FIG. 1, negative voltage lines in a display panel 110 include a ring-shaped edge voltage line TEL, BEL, LEL and REL and a plurality of compensation negative voltage lines CL1~CLk. The number of the compensation negative voltage lines CL1~CLk may be varied according to design and resolution of the display panel 110. The lead lines IL1 and IL2 for applying a negative power supply voltage ELVSS are illustrated together in FIG. 1 and other signal and voltage lines such as positive voltage lines, data lines, gate lines, etc. are omitted in FIG. 1.

As will be described with reference to FIGS. 2, 6, and 7, a plurality of pixel units are formed in a matrix form of rows and columns in an active region ACTR of the display panel 110, and a cathode electrode CE is formed in a cathode region CTHR, such that the cathode electrode CE covers the entire active region ACTR.

The ring-shaped edge negative voltage line TEL, BEL, LEL, and REL is formed in a ring-shaped edge portion of the cathode electrode CE to drive (or apply) the negative power supply voltage ELVSS to the cathode electrode CE. The compensation negative voltage lines CL1~CLk are connected to the ring-shaped edge negative voltage line TEL, BEL, LEL and REL, and the compensation negative voltage lines CL1~CLk extend in a column direction Y and arranged (e.g., arranged repeatedly or spaced apart from one another) along a row direction X.

As illustrated in FIG. 1, the ring-shaped edge negative voltage line may have a rectangular shape including a top edge line TEL, a bottom edge line BEL, a left edge line LEL and a right edge line REL. The top edge line TEL is formed in a top edge portion of the cathode electrode CE and the top edge line TEL extends in the row direction X. The bottom edge line BEL is formed in a bottom edge portion of the cathode electrode CE and the bottom edge line BEL extends in the row direction X. The left edge line LEL is formed in a left edge portion of the cathode electrode CE and the left edge line LEL extends in the column direction Y. The right edge line REL is formed in a right edge portion of the cathode electrode CE and the right edge line REL extends in the column direction Y.

The compensation negative voltage lines CL1~CLk extending in the column direction Y may be connected to the top edge line TEL and the bottom edge line BEL extending in the row direction X. Example embodiments of connections between the compensation negative voltage lines CL1~CLk and the edge negative voltage lines TEL and BEL are described with reference to FIGS. 3A, 3B, 4A, 4B, 5A, and 5B illustrating a portion region PR, and example embodiments of the layout of signal and voltage lines are described with reference to FIGS. 6, 7, 8A, 8B, 9, 10A, 10B, 11A, 11B, 12A, 12B, 13, 14, 15A, and 15B.

As such, the display panel 110 according to example embodiments may efficiently reduce the ohmic drop of the negative power supply voltage ELVSS using the compensation negative voltage lines CL1~CLk and thus the power consumption may be reduced without changing the established manufacturing processes excessively.

Figure 2:
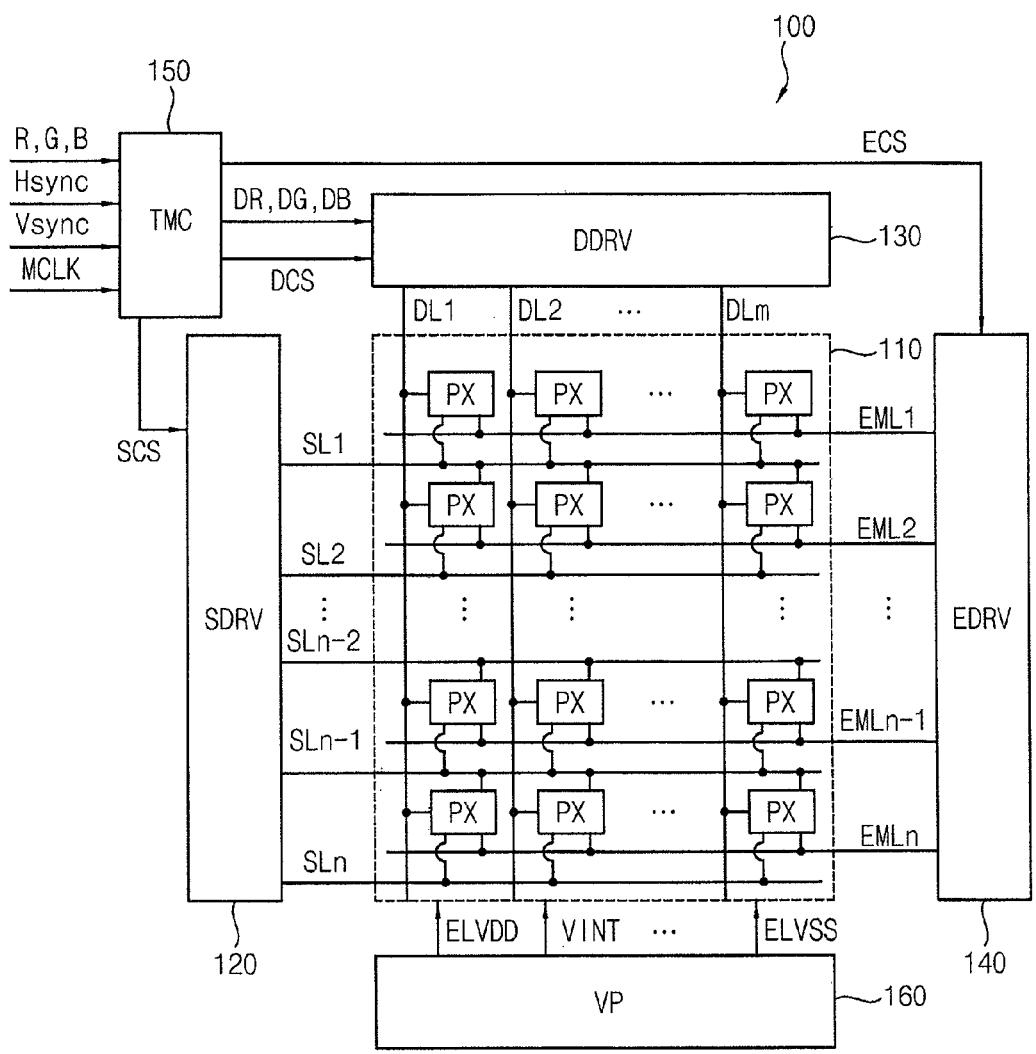
FIG. 2 is a block diagram illustrating a display device according to example embodiments of the present invention.

FIG. 2 is a block diagram illustrating a display device according to example embodiments of the present invention.

A display device 100 or a display module illustrated in FIG. 2 may be an electroluminescent display device including a light-emitting diode (LED) or an organic light-emitting diode (OLED) that emits light through the recombination of electrons and holes.

The display device 100 may include a display panel 110 including a plurality of pixel units PX, a scan driver SDRV 120, a data driver DDRV 130, an emission control driver EDRV 140, a timing controller TMC 150 and a voltage providing circuit VP 160.

As described with reference to FIG. 1, the display panel 110 may include the cathode electrode CE, the ring-shaped edge negative voltage line TEL, BEL, LEL and REL and the plurality of compensation negative voltage lines CL1~CLk. The cathode electrode CE is formed in a cathode region CTHR, such that the cathode electrode CE covers the entire active region ACTR. The ring-shaped edge negative voltage line TEL, BEL, LEL and REL is formed in a ring-shaped edge portion of the cathode electrode CE to drive the negative power supply voltage ELVSS to the cathode electrode CE. The compensation negative voltage lines CL1~CLk are connected to the ring-shaped edge negative voltage line TEL, BEL, LEL and REL, and the compensation negative voltage lines CL1~CLk are extended in the column direction Y and arranged (e.g., arranged repeatedly or spaced apart from one another) along the row direction X.

The pixel units PX may be located (or disposed) at crossing regions (e.g., every cross portion) of row control lines (or scan lines) SL1~SLn, data lines DL1~DLm, and emission control lines EML1~EMLn. Each pixel unit PX may include a plurality of sub pixels. For example, each pixel unit PX may include a red sub pixel, a green sub pixel, and a blue sub pixel that are arranged along the row direction X. In this case, each of the data lines DL1~DLm illustrated in FIG. 2 may include three signal lines for driving the RGB sub pixels, respectively.

The pixel units PX may receive the positive power supply voltage ELVDD, the negative power supply voltage ELVSS, the initialization voltage VINT, etc. from the voltage providing circuit 160. The scan driver 120 may provide row control signals GW, GI and GB as illustrated in FIG. 6 to the pixel units PX by units of rows through the row control lines SL1~SLn. The data driver 130 may provide data signals DATA as illustrated in FIG. 6 to the pixel units PX by units of columns through data lines DL1~DLm. The emission control driver 140 may provide emission control signals EM as illustrated in FIG. 6 to the pixel units PX by units of rows through emission control lines EML1~EMLn.

The timing controller 150 may receive and convert image signals R, G, B from an external device and provide converted image data DR, DG, DB to the data driver 130. Also the timing controller 150 may receive a vertical synchronization signal Vsync, a horizontal synchronization signal Hsync, and a clock signal MCLK from the external device and generate control signals for the scan driver 120, the data driver 130, and the emission control driver 140. The timing controller 150 provides scan driving control signals SCS to the scan driver 120, data driving control signals DCS to the data driver 130 and emission driving control signals ECS to the emission control driver 140, respectively. Each pixel unit PX emits light by a driving current flowing through the LED or the OLED based on the data signals provided through the data lines DL1~DLm.

Figure 3A:
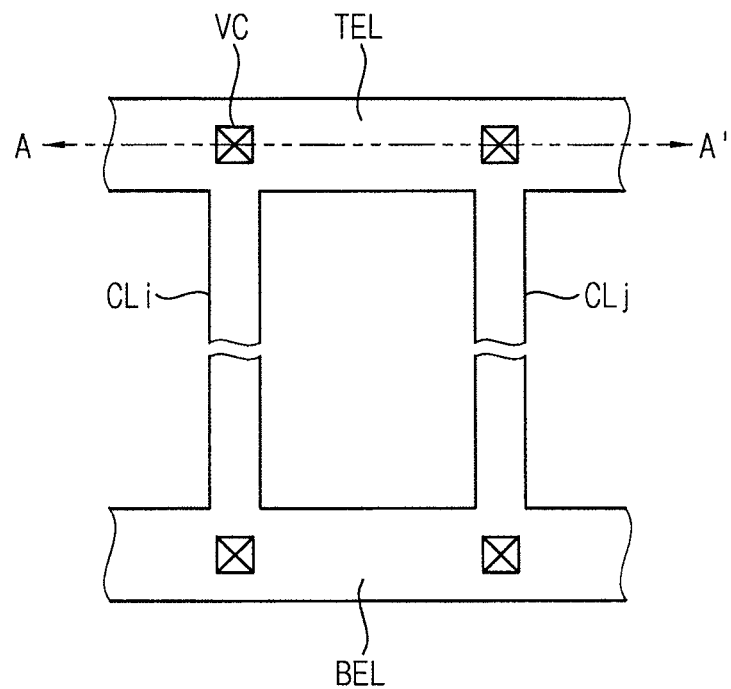
FIGS. 3A and 3B are diagrams illustrating an example connection of edge negative voltage lines and compensation negative voltage lines according to one embodiment of the present invention.
Figure 3B:
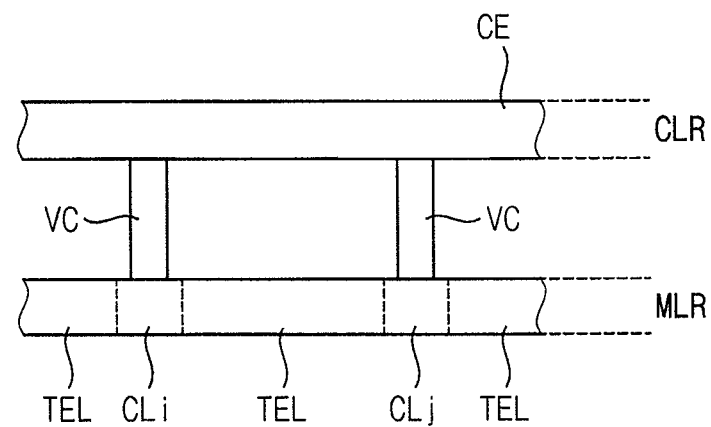

FIGS. 3A and 3B are diagrams illustrating an example connection of edge negative voltage lines and compensation negative voltage lines according to one embodiment of the present invention. FIG. 3A illustrates a top view of the portion region PR in FIG. 1 and FIG. 3B illustrates a cross-sectional view at a line A-A' in FIG. 3A.

Referring to FIGS. 3A and 3B, the top edge line TEL, the bottom edge line BEL, and the compensation negative voltage lines CLi and CLj may be formed in the same metal layer MLR. Even though not illustrated in FIGS. 3A and 3B, the left, edge line LEL and the right edge line REL in FIG. 1 may be formed in the same metal layer MLR. Accordingly the ring-shaped edge negative voltage line TEL, BEL, LEL, and REL may be formed in the metal layer MLR as the compensation negative voltage lines CL1~CLk.

The ring-shaped edge negative voltage line TEL, BEL, LEL, and REL and the compensation negative voltage lines CL1~CLk may be patterned through same manufacturing processes to be connected directly to each other. In addition, the ring-shaped edge negative voltage line TEL, BEL, LEL, and REL and the compensation negative voltage lines CL1~CLk may be connected to the cathode electrode CE formed in a cathode layer CLR through vertical contacts VC (e.g., contacts extending along a direction substantially perpendicular to the cathode electrode CE) such as vias.

Figure 4A:
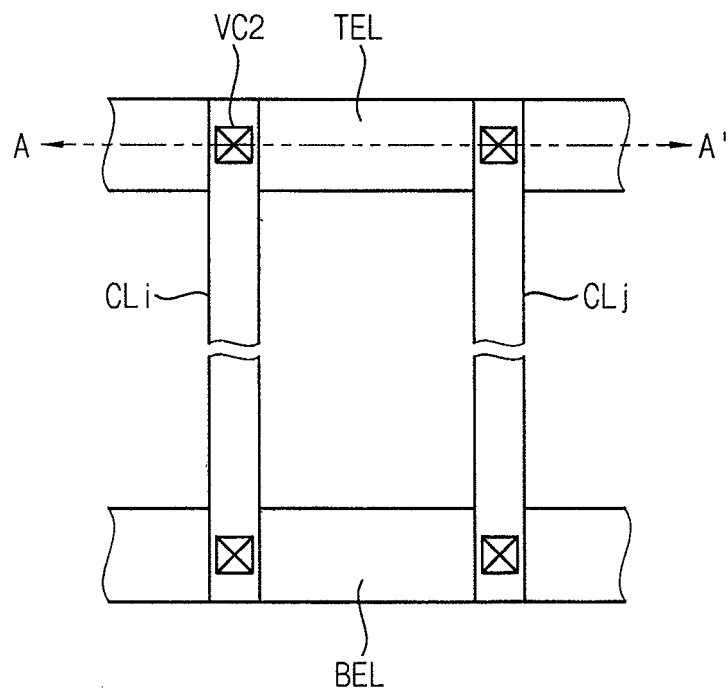
FIGS. 4A and 4B are diagrams illustrating another example connection of edge negative voltage lines and compensation negative voltage lines according to one embodiment of the present invention.
Figure 4B:
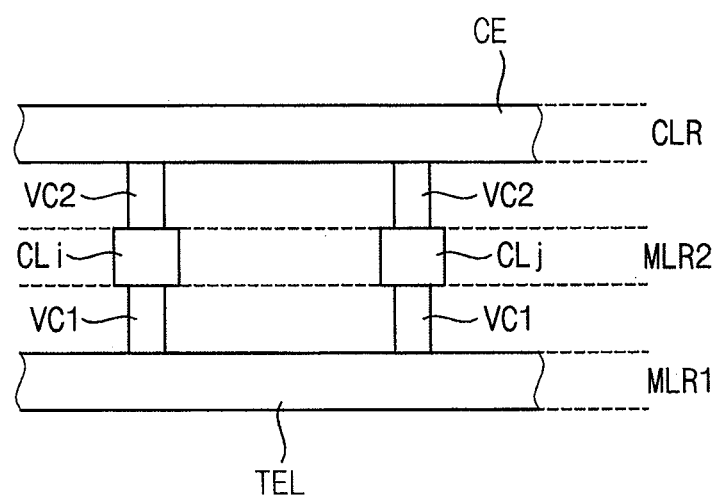

FIGS. 4A and 4B are diagrams illustrating another example connection of edge negative voltage lines and compensation negative voltage lines according to one embodiment of the present invention. FIG. 4A illustrates a top view of the portion region PR in FIG. 1 and FIG. 4B illustrates a cross-sectional view at a line A-A' in FIG. 4A.

Referring to FIGS. 4A and 4B, the top edge line TEL, the bottom edge line BEL, and the compensation negative voltage lines CLi and CLj may be formed in different metal layers MLR1 and MLR2, respectively. Even though not illustrated in FIGS. 4A and 4B, the left edge line LEL and the right edge line REL in FIG. 1 may be formed in the same metal layer MLR1 together with the top edge line TEL and the bottom edge line BEL. Accordingly the ring-shaped edge negative voltage line TEL, BEL, LEL, and REL may be formed in the first metal layer MLR1 and the compensation negative voltage lines CL1~CLk may be formed in the second metal layer MLR2 over the first metal layer MLR1.

The ring-shaped edge negative voltage line TEL, BEL, LEL and REL and the compensation negative voltage lines CL1~CLk may be connected to each other through the vertical contacts VC1. In addition, the ring-shaped edge negative voltage line TEL, BEL, LEL and REL and the compensation negative voltage lines CL1~CLk may be connected to the cathode electrode CE formed in a cathode layer CLR through the vertical contacts VC2.

Figure 5A:
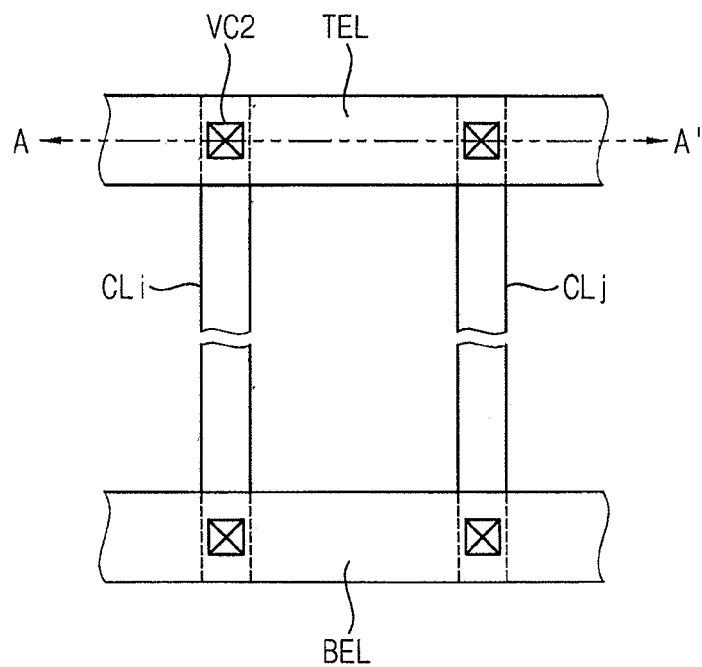
FIGS. 5A and 5B are diagrams illustrating still another example connection of edge negative voltage lines and compensation negative voltage lines according to one embodiment of the present invention.
Figure 5B:
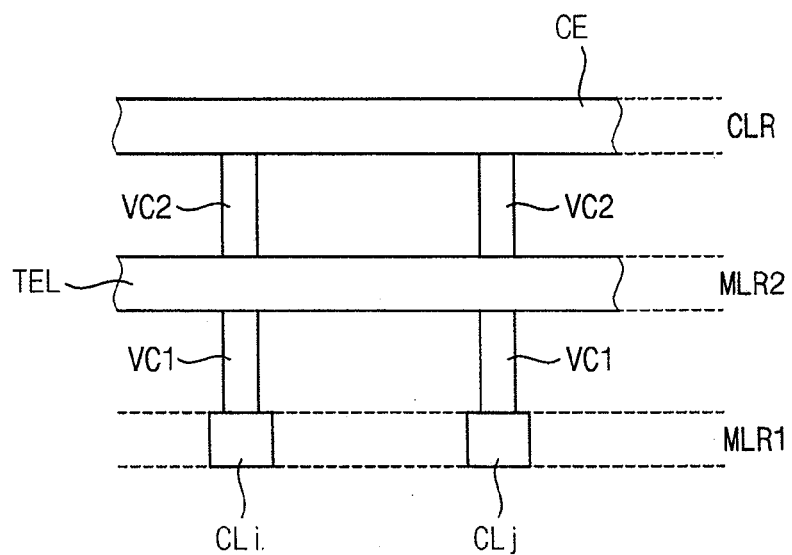

FIGS. 5A and 5B are diagrams illustrating still another example connection of edge negative voltage lines and compensation negative voltage lines according to one embodiment of the present invention. FIG. 5A illustrates a top view of the portion region PR in FIG. 1 and FIG. 5B illustrates a cross-sectional view at a line A-A' in FIG. 5A.

Referring to FIGS. 5A and 5B, the top edge line TEL, the bottom edge line BEL, and the compensation negative voltage lines CLi and CLj may be formed in different metal layers MLR1 and MLR2, respectively. Even though not illustrated in FIGS. 4A and 4B, the left edge line LEL and the right edge line REL in FIG. 1 may be formed in the same metal layer MLR2 together with the top edge line TEL and the bottom edge line BEL. Accordingly the ring-shaped edge negative voltage line TEL, BEL, LEL, and REL may be formed in the second metal layer MLR2 and the compensation negative voltage lines CL1~CLk may be formed in the first metal layer MLR1 below the first metal layer MLR1.

The ring-shaped edge negative voltage line TEL, BEL, LEL, and REL and the compensation negative voltage lines CL1~CLk may be connected to each other through the vertical contacts VC1. In addition, the ring-shaped edge negative voltage line TEL, BEL, LEL and REL and the compensation negative voltage lines CL1~CLk may be connected to the cathode electrode CE formed in a cathode layer CLR through the vertical contacts VC2.

Figure 6:
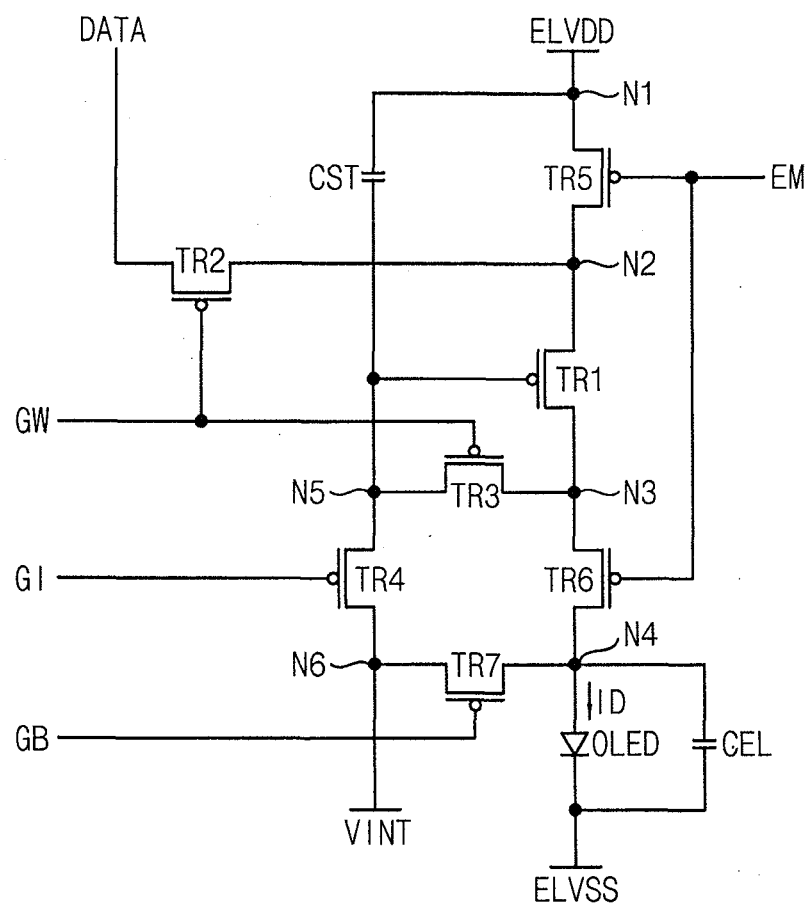
FIG. 6 is a circuit diagram illustrating an example of a pixel included in the display device of FIG. 2 according to one embodiment of the present invention.

FIG. 6 is a circuit diagram illustrating an example of a pixel included in the display device of FIG. 2 according to one embodiment of the present invention.

Referring to FIG. 6, a pixel SPX may be a sub pixel included in each pixel unit PX, The pixel SPX may include an OLED, a first transistor TR1, a second transistor TR2, a third transistor TR3, a storage capacitor CST, a fourth transistor TR4, a fifth transistor TR5, a sixth transistor TR6, and a seventh transistor TR7, which are connected through first, second, third, fourth, fifth, and sixth nodes N1, N2, N3, N4, N5, and N6. In an example embodiment, the pixel PX may further include a diode parallel capacitor (e.g., a capacitor in parallel with the OLED) CEL. In another example embodiment, the diode parallel capacitor CEL may be a capacitor formed by a parasitic capacitance (e.g., a parasitic capacitance of the OLED).

The OLED may emit light based on a driving current ID. The anode of the OLED may be connected to a negative power voltage ELVSS or a ground voltage and the cathode of the OLED may be connected to the fourth node N4.

The first transistor TR1 may include a gate electrode connected to the fifth node N5, a source electrode connected to the second node N2, and a drain electrode connected to the third node N3. The first transistor TR1 may generate the driving current ID. In an example embodiment, the first transistor TR1 may operate in the linear region. In this case, the first transistor TR1 may generate the driving current ID based on the voltage difference between the gate electrode and the source electrode and the gray level of the pixel (or grayscale level) may be represented based on the magnitude of the driving current ID. In another example embodiment, the first transistor TR1 may operate in the saturation region. In this case, the digital driving may be performed such that the gray level (or grayscale level) is represented by the sum of the times in each frame during which the driving current ID is provided to the OLED.

The second transistor TR2 may include a gate electrode receiving a scan signal GW, a source electrode receiving the data signal DATA and a drain electrode connected to the second node N2. The second transistor TR2 may transfer the data signal DATA to the source electrode of the first transistor TR1 during the activation time interval of the scan signal GW. In this case, the second transistor TR2 may operate in the linear region. In another embodiment, the second transistor TR2 operates in the saturation region.

The third transistor TR3 may include a gate electrode receiving the scan signal GW, a source electrode connected to the fifth node N5 and a drain electrode connected to the third node N3. The third transistor TR3 may electrically connect the gate electrode of the first transistor TR1 and the drain electrode of the first transistor TR1 during the activation time interval of the scan signal GW. In other words, the third transistor TR3 may form a diode-connection of (or diode-connect) the first transistor TR1 during the activation time interval of the scan signal GW. Through such a diode-connection, the data signal DATA, compensated with the respective threshold voltage of the first transistor TR1, may be provided to the gate electrode of the first transistor TR1. Such threshold voltage compensation may reduce or solve problems of the irregularity of the driving current ID due to deviations of the threshold voltage of the first transistor TR1.

The storage capacitor CST may be connected between the first node N1 and the fifth node N5. The storage capacitor CST maintains the voltage level on the gate electrode of the first transistor TR1 during the deactivation time interval of the scan signal GW. The deactivation time interval of the scan signal GW may include (e.g., overlap with) the activation time interval of an emission control signal EM. The driving current ID generated by the first transistor TR1 may be applied to the OLED during the activation time interval of the emission control signal EM.

The fourth transistor TR4 may include a gate electrode receiving a data initialization signal GI, a source electrode connected to the fifth node N5, and a drain electrode connected to the sixth node N6. The fourth transistor TR4 may provide an initialization voltage VINT to the gate electrode of the first transistor TR1 during the activation time interval of the data initialization signal GI. In other words, the fourth transistor TR4 may initialize the gate electrode of the first transistor TR1 with the initialization voltage VINT during the activation time interval of the data initialization signal GI. In an example embodiment, a voltage level of the initialization voltage VINT may be lower than a voltage level of the data signal DATA maintained by the storage capacitor CST in the previous frame (e.g., a previously stored data signal). The initialization voltage VINT may be applied to the gate electrode of the first transistor TR1 that is a P-type metal-oxide-semiconductor (PMOS) transistor. In another example embodiment, a voltage level of the initialization voltage VINT may be higher than the voltage level of the data signal DATA maintained by the storage capacitor CST in the previous frame. The initialization voltage VINT may be applied to the gate electrode of the first transistor TR1 that is an N-type metal-oxide-semiconductor (NMOS) transistor.

In one example embodiment, the data initialization signal GI may be identical to the scan signal GW advanced by one horizontal time. For example, the data initialization signal GI is applied to pixels located in the (n)th row, and the data initialization signal GI may be substantially the same as the scan signal GW applied to pixels located in the (n−1)th row. Thus, the data initialization signal GI that is activated may be applied to pixels located in the (n)th row by applying the scan signal GW that is activated to pixels located in the (n−1)th row. As a result, the gate electrode of the first transistor TR1 included in pixels located in the (n)th row may be initialized as the initialization voltage VINT when the data signal DATA is applied pixels located in the (n−1)th row.

The fifth transistor TR5 may include a gate electrode receiving the emission control signal EM, a source electrode connected to the first node N1, and a drain electrode connected to the second node N2. The fifth transistor TR5 may provide the positive power supply voltage ELVDD to the second node N2 during the activation time interval of the emission control signal EM. In addition, the fifth transistor TR5 may disconnect the second node N2 from the power supply voltage ELVDD during the deactivation time interval of the emission control signal EM. The first transistor TR1 may generate the driving current ID while the fifth transistor TR5 provides the power supply voltage ELVDD to the second node N2 during the activation time interval of the emission control signal EM. In addition, the data signal DATA compensated with the threshold voltage of the first transistor TR1 may be provided to the gate electrode of the first transistor TR1 while the fifth transistor TR5 disconnects the second node N2 from the power supply voltage ELVDD during the deactivation time interval of the emission control signal EM.

The sixth transistor TR6 may include a gate electrode receiving the emission control signal EM, a source electrode connected to the third node N3, and a drain electrode connected to the fourth node N4. The sixth transistor TR6 may provide the driving current ID generated by the first transistor TR1 to the OLED during the activation time interval of the emission control signal EM. In this case, the sixth transistor TR6 may operate in the linear region. In another embodiment, the sixth transistor TR6 operates in the saturation region. The sixth transistor TR6 may disconnect the first transistor TR1 from the OLED while the emission signal EM is deactivated such that the compensated data signal DATA applied to the second electrode of the first transistor TR1 is applied to the gate electrode of the first transistor TR1.

The seventh transistor TR7 may include a gate electrode receiving a diode initialization signal GB, a source electrode connected to the sixth node N6, and a drain electrode connected to the fourth node N4. The seventh transistor TR7 may provide the initialization voltage VINT to the anode of the OLED during the activation time interval of the diode initialization signal GB. In other words, the seventh transistor TR7 may initialize the anode of the OLED with the initialization voltage VINT during the activation time interval of the diode initialization signal GB.

In some example embodiments, the diode initialization signal GB may be the same as the data initialization signal GI. The initialization of the gate electrode of the first transistor TR1 and the initialization of the anode of the OLED may not affect each other, that is, they may be independent of each other. Thus the diode initialization signal GB and the data initialization signal GI may be combined as one signal.

Figure 14:
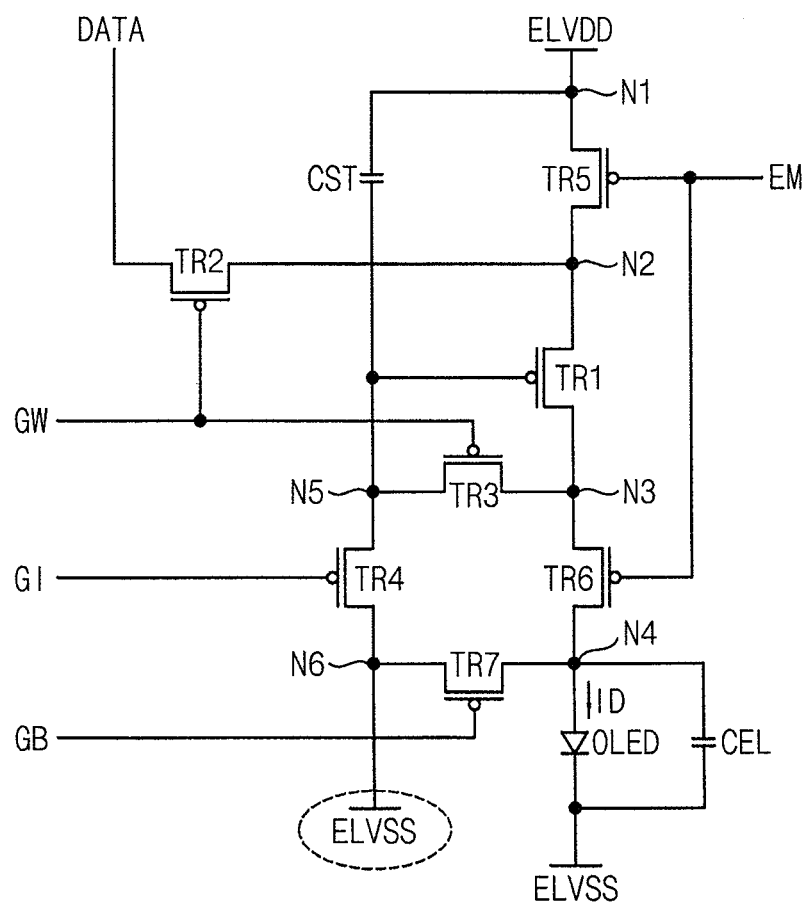
FIG. 14 is a circuit diagram illustrating an example of a pixel included in the display device of FIG. 2.

The initialization voltage VINT may depend on the characteristics of the diode parallel capacitor CEL and the initialization voltage VINT may be set to a sufficiently low voltage. In an example embodiment, the initialization voltage VINT may be set to the negative power supply voltage ELVSS, as illustrated in FIG. 14.

Figure 7:
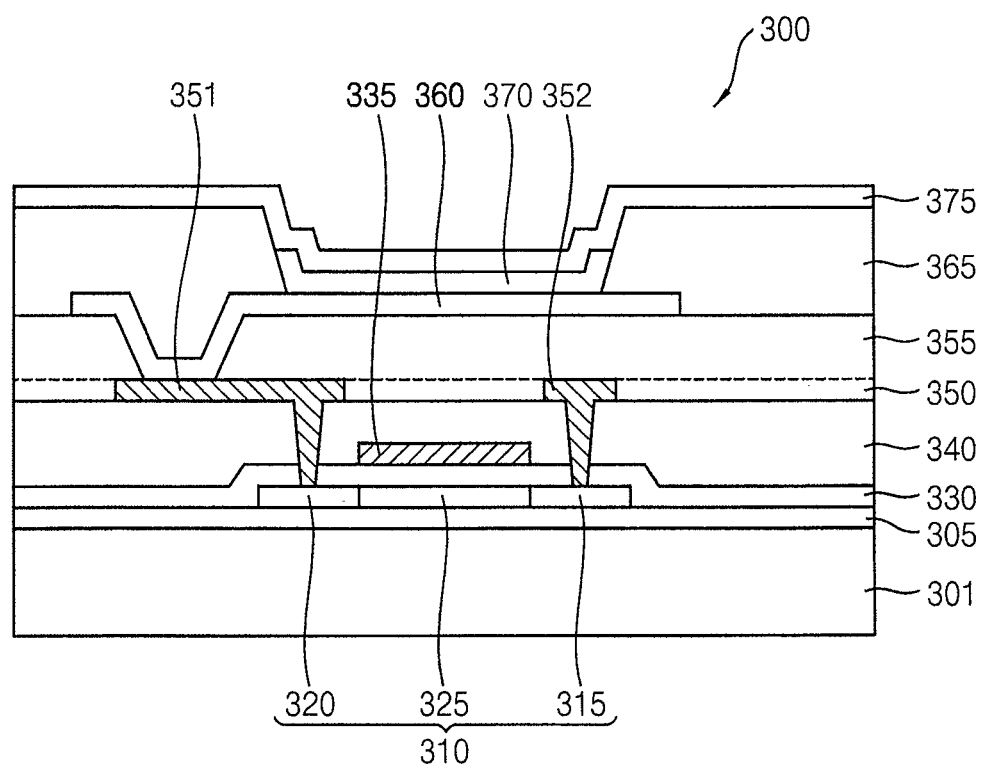
FIG. 7 is a cross-sectional view for describing a vertical structure of a display panel included in the display device of FIG. 2 according to one embodiment of the present invention.

FIG. 7 is a cross-sectional view for describing a vertical structure of a display panel included in the display device of FIG. 2 according to one embodiment of the present invention. FIG. 7 illustrates only the sixth transistor TR6 and the OLED among the elements in the pixel SPX of FIG. 6.

Referring to FIG. 7, the display panel 300 may include a substrate 301, a buffer layer 305, an active pattern 310, a gate insulation layer 330, a sixth gate electrode 335, a first insulation interlayer 340, connection patterns 351 and 352 formed in the metal layer 350, a second insulation interlayer 355, an anode electrode 360, a pixel definition layer 365, an organic light-emitting layer 370, and a cathode electrode 375.

The buffer layer 305 is formed on the substrate 301 and the active pattern 310 may be formed on the buffer layer 305, where the substrate 301 may include an insulation material such as glass, transparent plastic, ceramic, etc. The active pattern 310 may be formed by a sputtering process, a CVD process, a printing process, a spray process, a vacuum deposition process, an ALD process, a sol-gel process, PECVD process, etc. The active pattern 310 may include source and drain regions 315 and 320 and channel region 325 located below the sixth gate electrode 335.

The gate insulation layer 330 may be formed to cover the active pattern 310. The gate insulation layer 330 may be formed by a CVD process, a thermal oxidation process, a plasma enhanced chemical vapor deposition (PECVD) process, a high density plasma-chemical vapor deposition (HDP-CVD) process, etc. The gate insulation layer 330 may be a relatively thick to sufficiently cover the active pattern 310.

The gate electrode 335 may be formed on the gate insulation layer 330. The gate electrode 335 may be formed by a sputtering process, a CVD process, a printing process, a spray process, a vacuum deposition process, an ALD process, etc.

The active pattern 310 may be doped by the impurity after the gate electrode 335 is formed. The source and drain regions 315 and 320 may be doped by the impurity, and the channel region 325 located below the gate electrode 335 may be not doped. As a result, the source and drain regions 315 and 320 may act as the conductor and the channel region 325 may act as the channel of the sixth transistor TR6.

The first insulation interlayer 340 may be formed on the gate insulation layer 330 to cover the gate electrode 335. The first insulation interlayer 340 may be a relatively thick to sufficiently cover the sixth gate electrode 335. The first insulation interlayer 340 may have a substantially flat upper surface. In one example embodiment, a planarization process may be executed on the first insulation interlayer 340 to enhance the flatness of the first insulation interlayer 340.

The first insulation interlayer 340 may be partially etched to form contact holes partially exposing the source and drain regions 315 and 320 of the active pattern 310. The connection patterns 351 and 352 may be formed in the metal layer 350 by filling the contact holes.

The second insulation interlayer 355 may be formed on the first insulation interlayer 340 to cover the connection patterns 351 and 352. The second insulation interlayer 355 may be a relatively thick to sufficiently cover the connection patterns 351 and 352. The second insulation interlayer 355 may have a substantially flat upper surface. In one example embodiment, a planarization process may be executed on the second insulation interlayer 355 to enhance the flatness of the second insulation interlayer 355.

The second insulation interlayer 355 may be partially etched to form a contact hole partially exposing a portion of the connection pattern 351. The anode electrode 360 may be formed on the second insulation interlayer 355 by filling the contact hole.

The pixel definition layer 365 may be formed on the second insulation interlayer 355 to cover the anode electrode 360. The pixel definition layer 365 may be relatively thick to sufficiently cover the anode electrode 360.

The pixel definition layer 365 may be partially etched to form an opening that exposes the anode electrode 360. The organic light emitting layer 370 may be disposed in the opening. The organic light emitting layer 370 may be disposed on the anode electrode 360 exposed by the opening.

The cathode electrode 375 may be formed on the pixel definition layer 365 and organic light emitting layer 370. As described with reference to FIG. 1, the cathode electrode is formed as a whole to cover the entire active region ACTR in which the pixel units are formed.

Figure 8A:
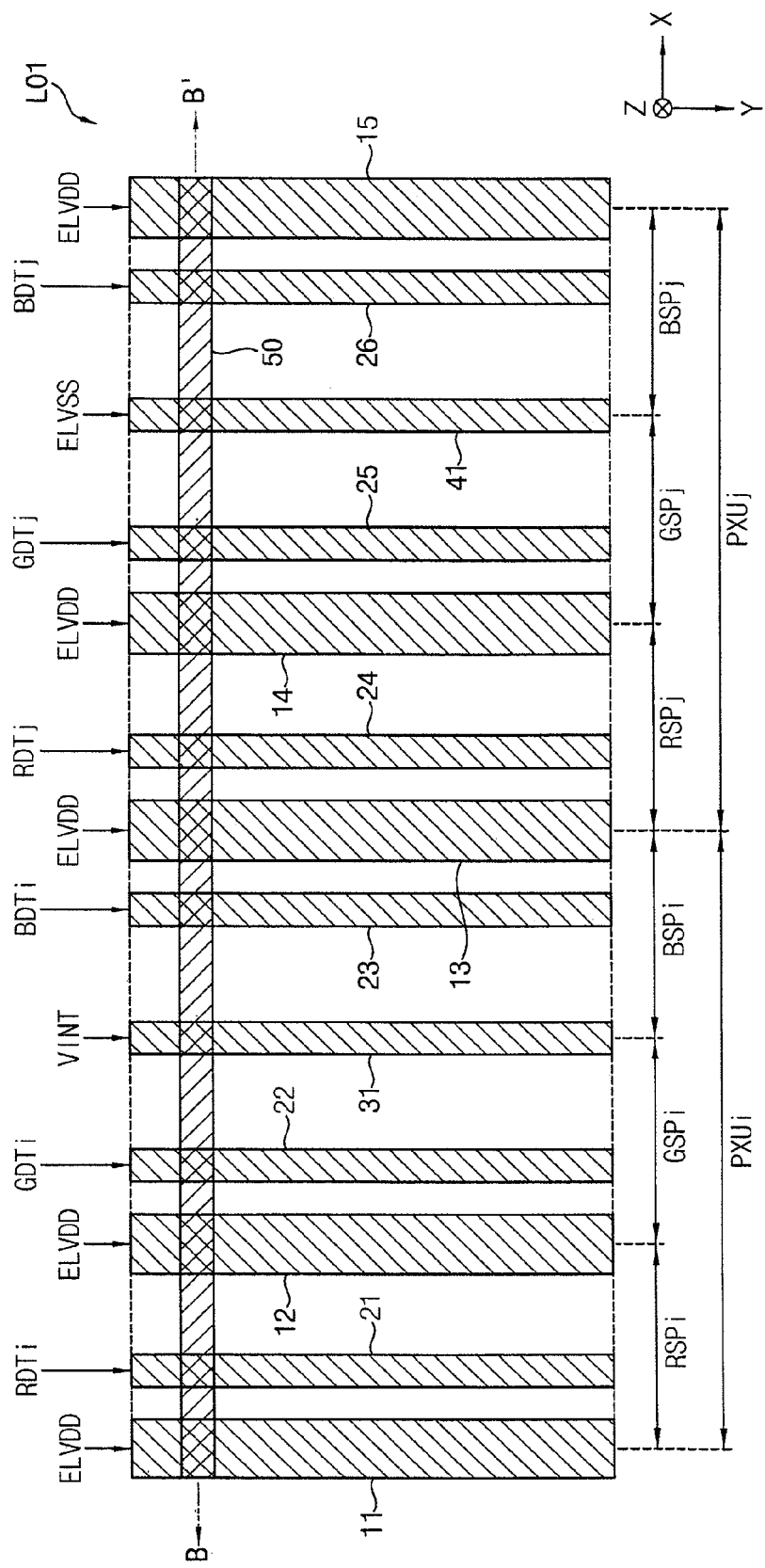
FIGS. 8A and 8B are diagrams illustrating a layout of voltage lines according to an example embodiment of the present invention.
Figure 8B:
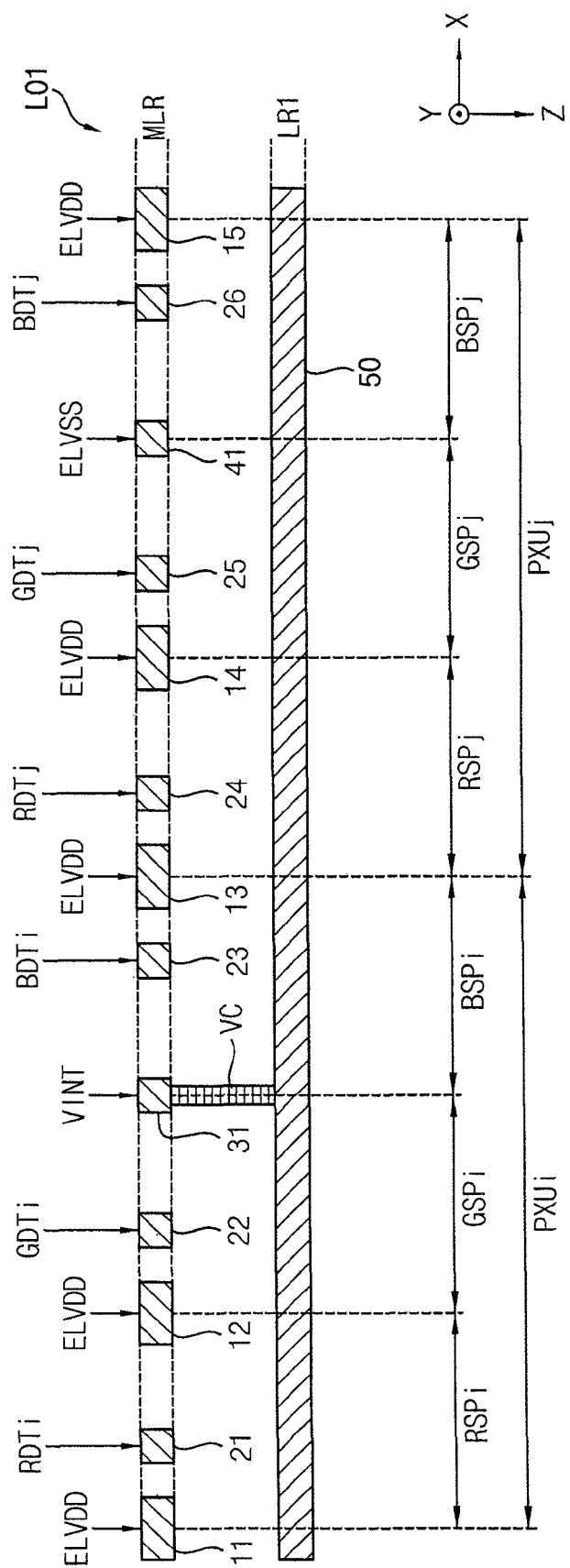

FIGS. 8A and 8B are diagrams illustrating a layout of voltage lines according to an example embodiment. Two pixel units PXUi and PXUj adjacent in the row direction X are illustrated in FIGS. 8A and 8B. FIG. 8B is a cross-sectional view at a line B-B' in FIG. 8A. Data lines 21, 22, 23, 24, 25, and 26 are illustrated in addition to voltage lines in FIGS. 8A and 8B.

For example, as illustrated in FIGS. 8A and 8B, the pixel units PXUi and PXUj may include red sub pixels RSPi and RSPj, green sub pixels GSPi and GSPj and blue sub pixels BSPi and BSPj, respectively. The arrangement order of the R, G, and B sub pixels in each pixel unit may be changed. The sub pixels RSPi, GSPi, BSPi, RSPj, GSPj, and BSPj may receive data signals RDTi, GDTi, BDTi, RDTj, GDTj, and BDTj through the data lines 21, 22, 23, 24, 25, and 26, respectively.

Referring to FIGS. 8A and 8B, a layout LO1 of voltage lines may include a plurality of compensation negative voltage lines 41, a plurality of positive voltage lines 11, 12, 13, 14, and 15, and a plurality of initialization voltage lines 31. Even though the one compensation negative voltage line 41 and the one initialization voltage line 31 are illustrated in FIGS. 8A and 8B, patterns substantially identical to that of FIGS. 8A and 8B are repeated in the row direction X and in the column direction Y and thus a plurality of compensation negative voltage lines 41 and a plurality of initialization voltage lines 31 may be included in the display panel.

The positive voltage lines 11, 12, 13, 14, and 15 are formed in a first metal layer MLR to provide the positive power supply voltage ELVDD to the pixel units. The positive voltage lines 11, 12, 13, 14, and 15 extend in the column direction Y and are arranged (e.g., arranged repeatedly or spaced apart from one another) along the row direction X. The initialization voltage lines 31 are formed in the first metal layer MLR to provide the initialization voltage VINT to the pixel units. The initialization voltage lines 31 extend in the column direction Y and arranged (e.g., arranged repeatedly or spaced apart from one another) along the row direction X.

The initialization lines 31 may be connected to a line 50 through vertical contacts VC, where the line 50 is formed in a conduction layer LR1 below the first metal layer MLR and extended in the row direction X. The initialization voltage VINT may be provided to the sub pixels RSPi, GSPi, BSPi, RSPj, GSPj, and BSPj arranged in the row direction X uniformly using the line 50 extending in the row direction X.

As illustrated in FIGS. 8A and 8B, the compensation negative voltage lines 41 may be formed in the first metal layer MLR through manufacturing processes equal to manufacturing processes of the positive voltage lines 11, 12, 13, 14, and 15 and the initialization voltage lines 31. FIGS. 8A and 8B illustrate an example embodiment that the one initialization voltage line 31 and the one compensation negative voltage line 41 are arranged per the two pixel units PXUi and PXUj.

Figure 9:
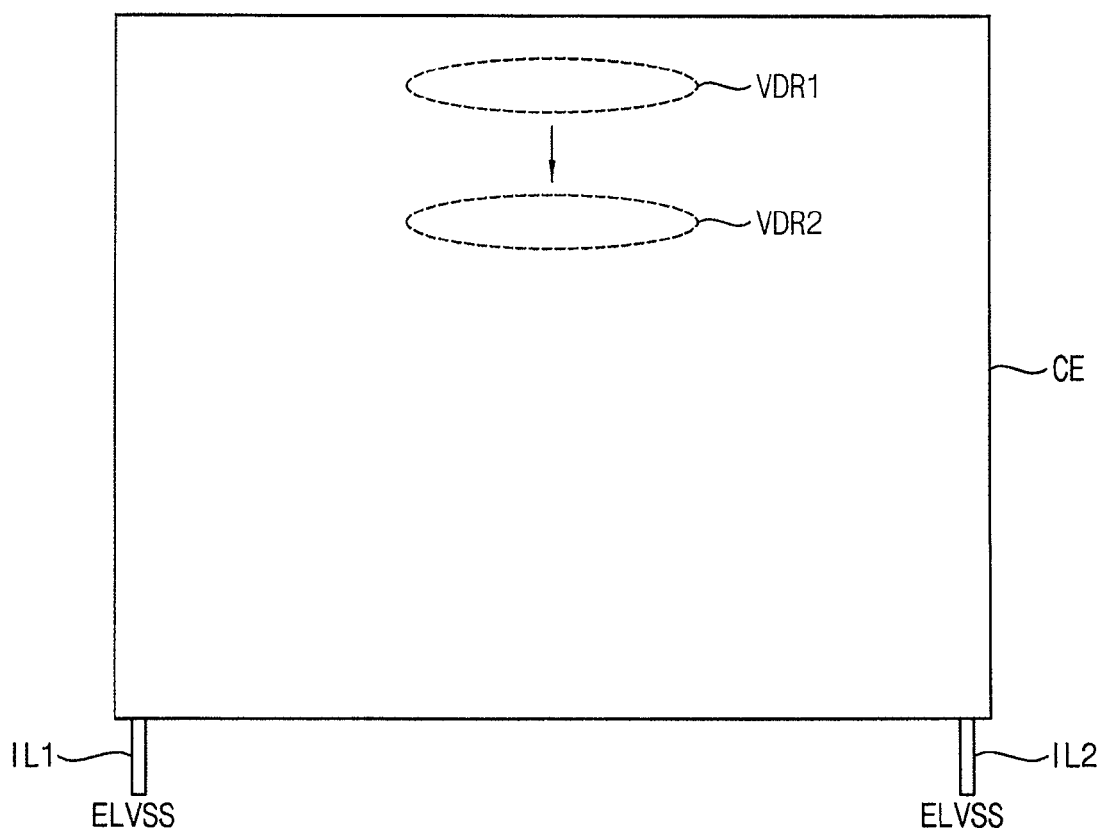
FIG. 9 is a diagram for describing a voltage distribution in a cathode electrode.

FIG. 9 is a diagram for describing a voltage distribution in a cathode electrode. When the negative power supply voltage ELVSS is provided through the lead lines IL1 and IL2 formed in bottom portion of the display panel, the ohmic drop of the negative power supply voltage ELVSS is most severe in a top-center portion of the cathode electrode CE.

In FIG. 9, a first region VDR1 is a most severe ohmic drop region when the compensation negative voltage lines are not implemented and a second region VDR2 is a most severe ohmic drop region when the compensation negative voltage lines are implemented. As an example, the negative power supply voltage ELVSS of about −5V has been applied to a display panel having a resolution of 10.5-inch wide quad extended graphic array (WQXGA), The ohmic drop of about 2.0V has occurred in the first region VDR1 in the conventional structure, but the ohmic drop of about 1.3V has occurred in the second region VDR2 in the structure according to example embodiments.

The display panel and the display module including the display panel according to example embodiments may efficiently reduce the ohmic drop of the negative power supply voltage using the compensation negative voltage lines and thus the power consumption may be reduced without changing the established manufacturing processes excessively.

Figure 10A:
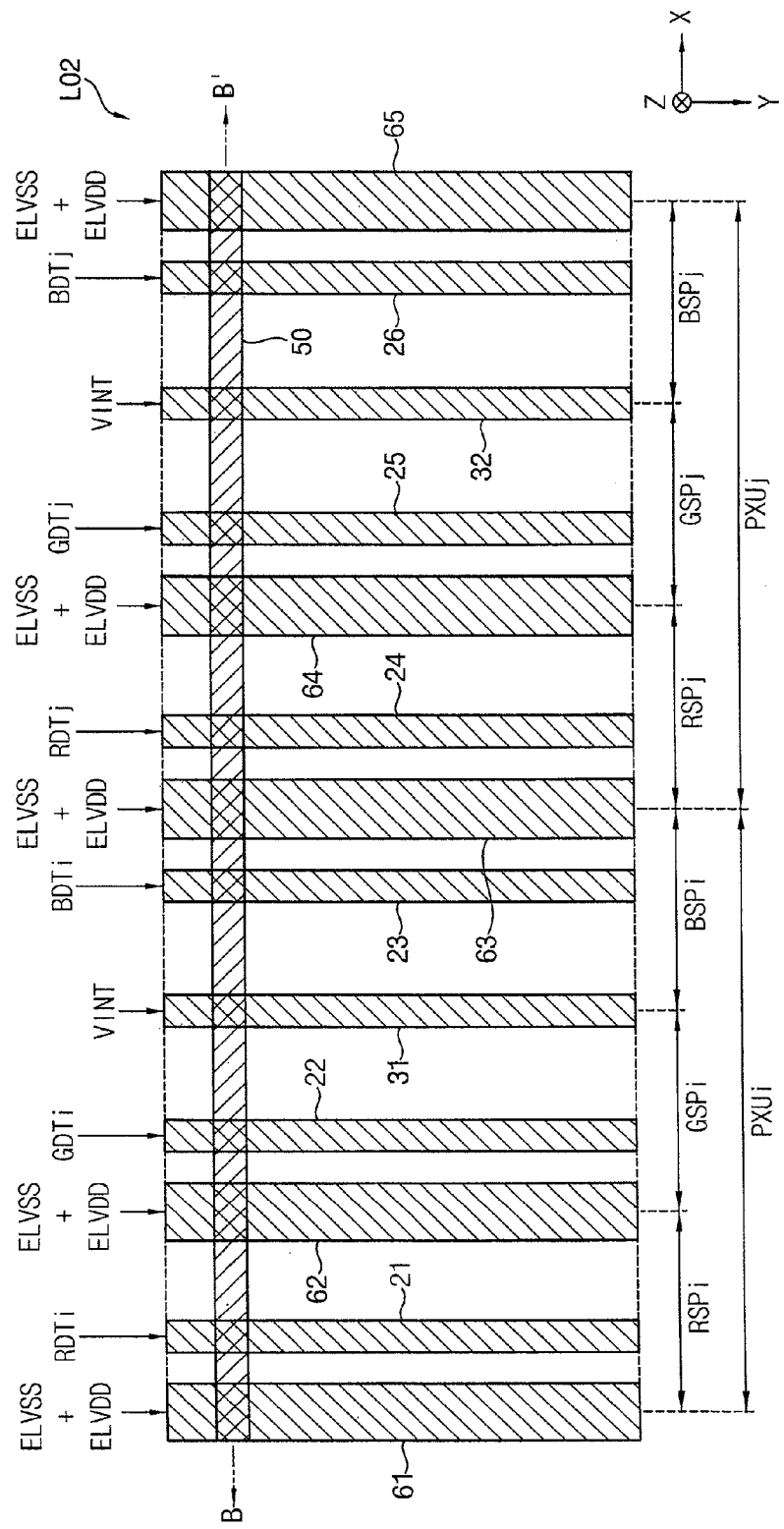
FIGS. 10A and 10B are diagrams illustrating a layout of voltage lines according to another example embodiment of the present invention.
Figure 10B:
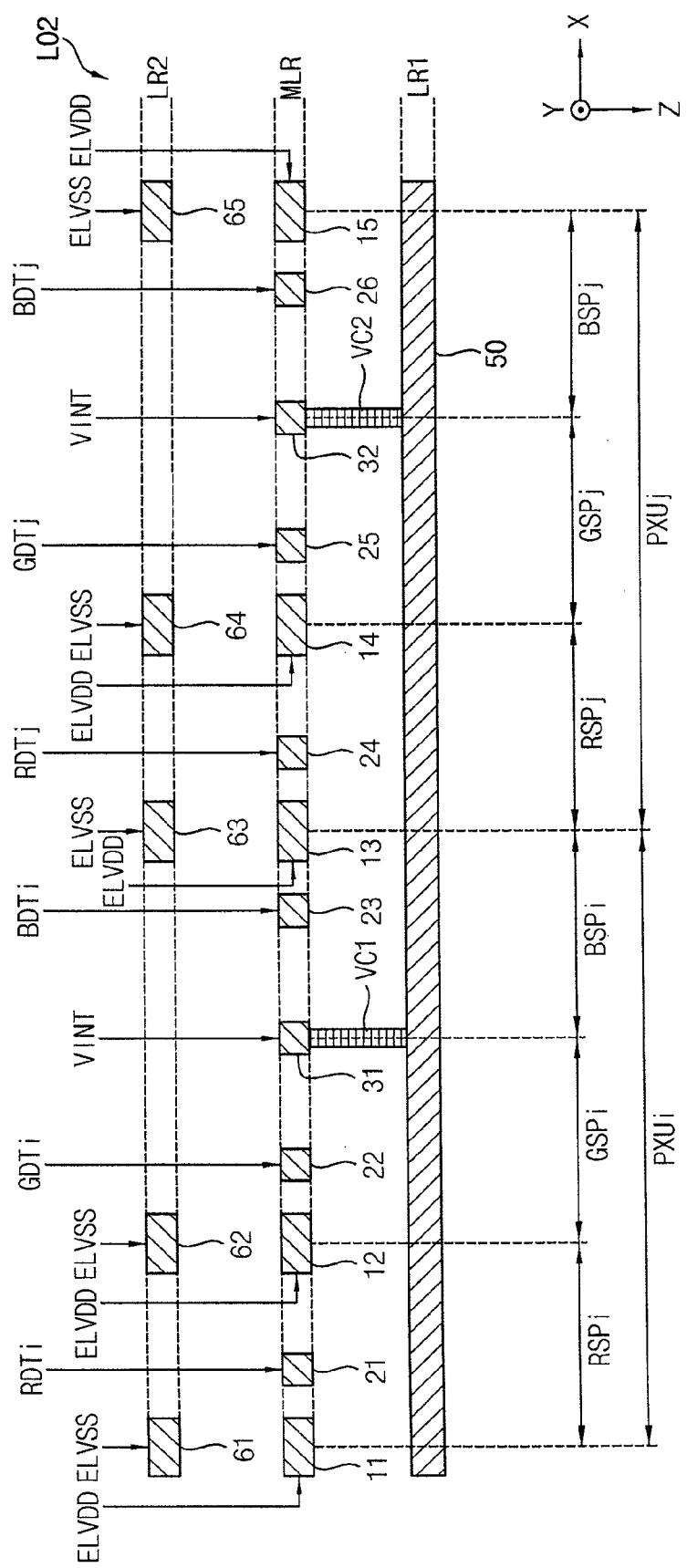

FIGS. 10A and 10B are diagrams illustrating a layout of voltage lines according to another example embodiment of the present invention. Two pixel units PXUi and PXUj adjacent along the row direction X are illustrated in FIGS. 10A and 10B. FIG. 10B is a cross-sectional view at a line B-B' in FIG. 10A. Data lines 21, 22, 23, 24, 25, and 26 are illustrated in addition to voltage lines in FIGS. 10A and 10B.

For example, as illustrated in FIGS. 10A and 10B, the pixel units PXUi and PXUj may include red sub pixels RSPi and RSPj, green sub pixels GSPi and GSPj, and blue sub pixels BSPi and BSPj, respectively. The arrangement order of the R, G, and B sub pixels in each pixel unit may be changed. The sub pixels RSPi, GSPi, BSPi, RSPj, GSPj, and BSPj may receive data signals RDTi, GDTi, BDTi, RDTj, GDTj, and BDTj through the data lines 21, 22, 23, 24, 25, and 26, respectively.

Referring to FIGS. 10A and 10B, a layout LO2 of voltage lines may include a plurality of compensation negative voltage lines 61, 62, 63, 64, and 65, a plurality of positive voltage lines 11, 12, 13, 14, and 15, and a plurality of initialization voltage lines 31 and 32. The patterns substantially identical to that of FIGS. 10A and 10B are repeated in the row direction X and in the column direction Y.

The positive voltage lines 11, 12, 13, 14, and 15 are formed in a first metal layer MLR to provide the positive power supply voltage ELVDD to the pixel units. The positive voltage lines 11, 12, 13, 14, and 15 are extended in the column direction Y and arranged (e.g., arranged repeatedly or spaced apart from one another) along the row direction X. The initialization voltage lines 31 and 32 are formed in the first metal layer MLR to provide the initialization voltage VINT to the pixel units. The initialization voltage lines 31 and 32 are extended in the column direction Y and arranged (e.g., arranged repeatedly or spaced apart from one another) along the row direction X.

The initialization lines 31 and 32 may be connected to a line 50 through vertical contacts VC1 and VC2, where the line 50 is formed in a conduction layer LR1 below the first metal layer MLR and extended in the row direction X. The initialization voltage VINT may be provided to the sub pixels RSPi, GSPi, BSPi, RSPj, GSPj, and BSPj arranged in the row direction X uniformly using the line 50 extended in the row direction X.

As illustrated in FIGS. 10A and 10B, the compensation negative voltage lines 61, 62, 63, 64, and 65 may be formed in a conduction layer LR2 over the first metal layer MLR through manufacturing processes different from manufacturing processes of the positive voltage lines 11, 12, 13, 14, and 15 and the initialization voltage lines 31 and 32. The conduction layer LR2 may be a second metal layer in which metal patterns are formed. FIGS. 10A and 10B illustrate an example embodiment that the one initialization voltage line and the two positive voltage lines are arranged per the one pixel unit, the compensation negative voltage lines are formed over (e.g., overlapping) the positive voltage lines and thus the two compensation negative voltage lines are arranged per the one pixel unit.

Figure 11B:
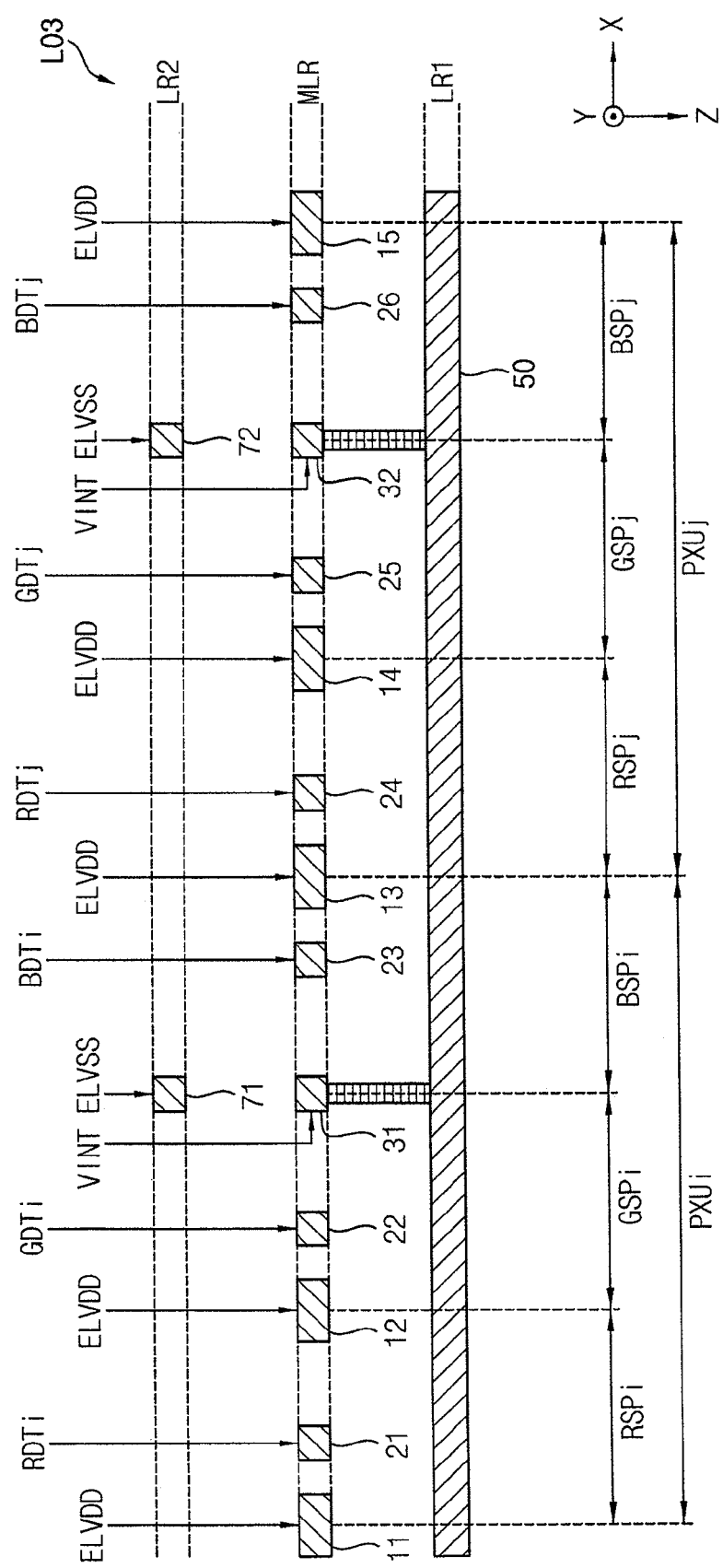

FIGS. 11A and 11B are diagrams illustrating a layout of voltage lines according to still another example embodiment of the present invention. The descriptions of aspects that are similar to those of FIGS. 10A and 10B are omitted.

Referring to FIGS. 11A and 11B, a layout LO3 of voltage lines may include a plurality of compensation negative voltage lines 71 and 72, a plurality of positive voltage lines 11, 12, 13, 14, and 15, and a plurality of initialization voltage lines 31 and 32. The patterns identical to that of FIGS. 11A and 11B are repeated along the row direction X and along the column direction Y.

As illustrated in FIGS. 11A and 11B, the compensation negative voltage lines 71 and 72 may be formed in a conduction layer LR2 over the first metal layer MLR through manufacturing processes different from manufacturing processes of the positive voltage lines 11, 12, 13, 14, and 15 and the initialization voltage lines 31 and 32. The conduction layer LR2 may be a second metal layer in which metal patterns are formed. FIGS. 11A and 11B illustrate an example embodiment in which the one initialization voltage line and the two positive voltage lines are arranged per the one pixel unit, the compensation negative voltage lines are formed over (e.g., overlapping) the initialization voltage lines and thus the one compensation negative voltage lines is arranged per the one pixel unit.

Figure 12A:
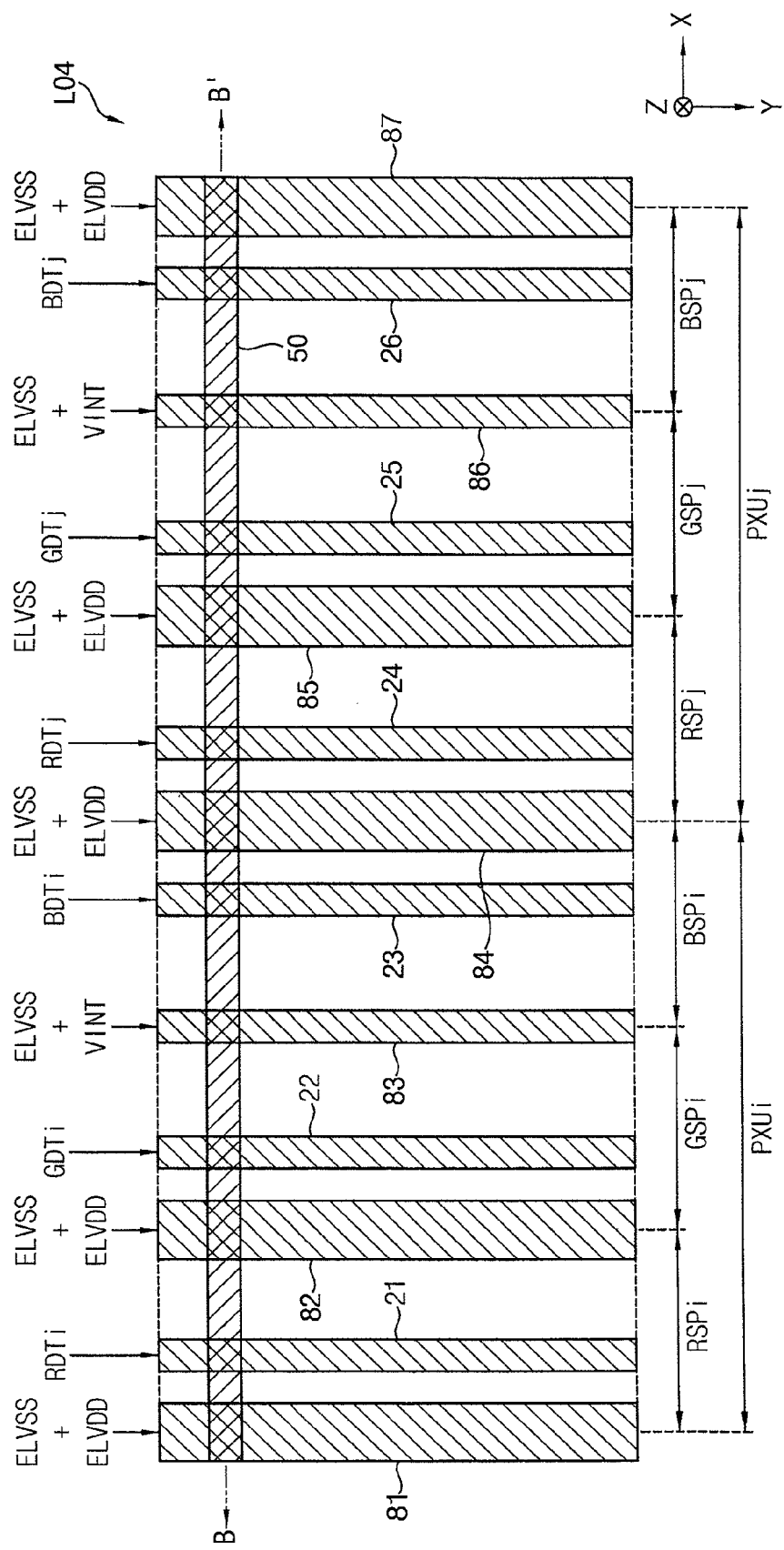
FIGS. 12A and 12B are diagrams illustrating a layout of voltage lines according to still another example embodiment of the present invention.
Figure 12B:
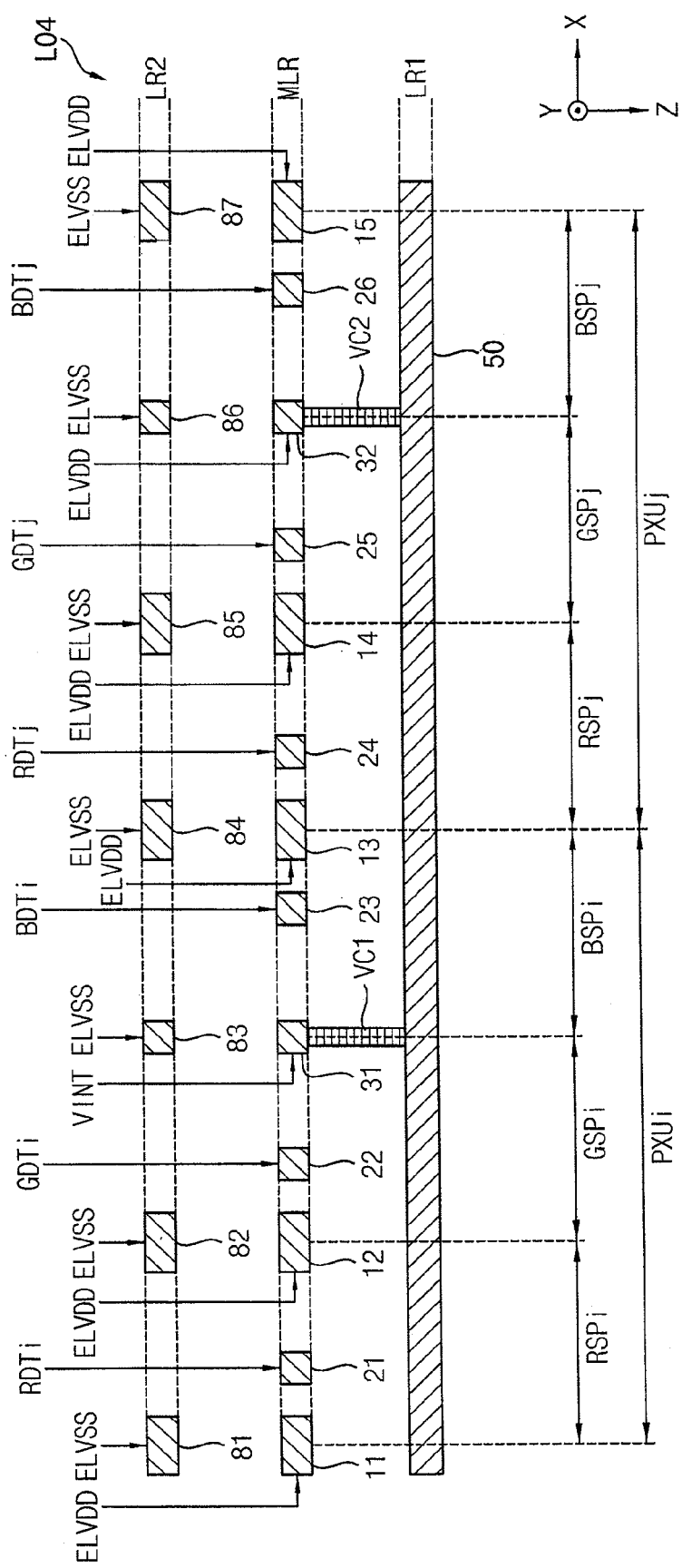

FIGS. 12A and 12B are diagrams illustrating a layout of voltage lines according to still another example embodiment of the present invention.

Referring to FIGS. 12A and 12B, a layout LO4 of voltage lines may include a plurality of compensation negative voltage lines 81, 82, 83, 84, 85, 86, and 87, a plurality of positive voltage lines 11, 12, 13, 14, and 15, and a plurality of initialization voltage lines 31 and 32. The patterns identical to that of FIGS. 12A and 12B are repeated along the row direction X and along the column direction Y.

As illustrated in FIGS. 12A and 12B, the compensation negative voltage lines 81, 82, 83, 84, 85, 86, and 87 may be formed in a conduction layer LR2 over the first metal layer MLR through manufacturing processes different from manufacturing processes of the positive voltage lines 11, 12, 13, 14, and 15 and the initialization voltage lines 31 and 32. The conduction layer LR2 may be a second metal layer in which metal patterns are formed. FIGS. 12A and 12B illustrate an example embodiment that the one initialization voltage line and the two positive voltage lines are arranged per the one pixel unit, the compensation negative voltage lines are formed over (e.g., overlapping) the initialization voltage lines and the positive voltage lines and thus the three compensation negative voltage lines are arranged per the one pixel unit.

Figure 13:
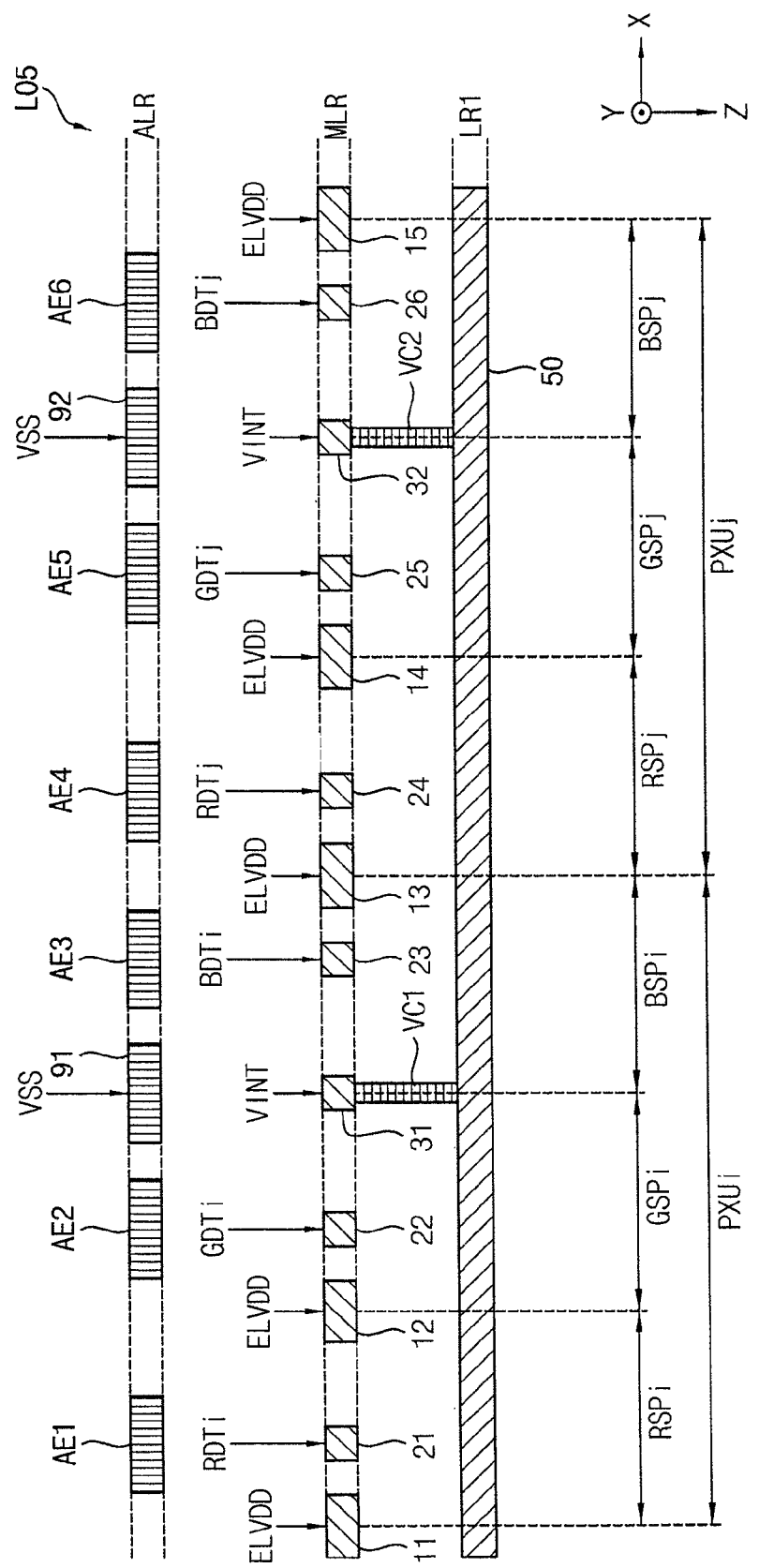
FIG. 13 is a cross-sectional view illustrating a layout of voltage lines according to still another example embodiment of the present invention.

FIG. 13 is a cross-sectional view illustrating a layout of voltage lines according to still another example embodiment.

Referring to FIG. 13, a layout LO5 of voltage lines may include a plurality of compensation negative voltage lines 91 and 92, a plurality of positive voltage lines 11, 12, 13, 14, and 15, and a plurality of initialization voltage lines 31 and 32. The patterns identical to that of FIG. 13 are repeated along the row direction X and along the column direction Y.

As illustrated in FIG. 13, the compensation negative voltage lines 91 and 92 may be formed in an anode layer ALR over the first metal layer MLR through manufacturing processes different from manufacturing processes of the positive voltage lines 11, 12, 13, 14, and 15 and the initialization voltage lines 31 and 32. The anode electrodes AE1~AE6 respectively included in the sub pixels RSPi, GSPi, BSPi, RSPj, GSPj, and BSPj are formed in the anode layer ALR. The compensation negative voltage lines 91 and 92 may be formed using the empty portions in the anode layer ALR.

FIG. 14 is a circuit diagram illustrating an example of a pixel included in the display device of FIG. 2 according to one embodiment of the present invention.

Referring to FIG. 14, a pixel SPX may be a sub pixel included in each pixel unit PX, The pixel SPX may include an OLED, a first transistor TR1, a second transistor TR2, a third transistor TR3, a storage capacitor CST, a fourth transistor TR4, a fifth transistor TR5, a sixth transistor TR6, and a seventh transistor TR7, which are connected through first, second, third, fourth, fifth, and sixth nodes N1, N2, N3, N4, N5, and N6. In an example embodiment, the pixel PX may further include a diode parallel capacitor CEL. In another example embodiment, the diode parallel capacitor (e.g., a capacitor in parallel with the OLED) CEL may be a capacitor formed by a parasitic capacitance (e.g., the parasitic capacitance of the OLED).

The OLED may emit light based on a driving current ID. The anode of the OLED may be connected to a negative power voltage ELVSS or a ground voltage and the cathode of the OLED may be connected to the fourth node N4.

The first transistor TR1 may include a gate electrode connected to the fifth node N5, a source electrode connected to the second node N2, and a drain electrode connected to the third node N3. The first transistor TR1 may generate the driving current ID. In an example embodiment, the first transistor TR1 may operate in the linear region. In this case, the first transistor TR1 may generate the driving current ID based on the voltage difference between the gate electrode and the source electrode and the gray level of the pixel (or grayscale level) may be represented based on the magnitude of the driving current ID. In another example embodiment, the first transistor TR1 may operate in the saturation region. In this case, the digital driving may be performed such that the gray level (or grayscale level) is represented by the sum of the times in each frame during which the driving current ID is provided to the OLED.

The second transistor TR2 may include a gate electrode receiving a scan signal GW, a source electrode receiving the data signal DATA, and a drain electrode connected to the second node N2. The second transistor TR2 may transfer the data signal DATA to the source electrode of the first transistor TR1 during the activation time interval of the scan signal GW. In this case, the second transistor TR2 may operate in the linear region. In another embodiment, the second transistor TR2 operates in the saturation region.

The third transistor TR3 may include a gate electrode receiving the scan signal GW, a source electrode connected to the fifth node N5 and a drain electrode connected to the third node N3. The third transistor TR3 may electrically connect the gate electrode of the first transistor TR1 and the drain electrode of the first transistor TR1 during the activation time interval of the scan signal GW. In other words, the third transistor TR3 may form a diode-connection of (or diode-connect) the first transistor TR1 during the activation time interval of the scan signal GW. Through such diode-connection, the data signal DATA compensated with the respective threshold voltage of the first transistor TR1 may be provided to the gate electrode of the first transistor TR1. Such threshold voltage compensation may reduce or solve problems of the irregularity of the driving current ID due to deviations of the threshold voltage of the first transistor TR1.

The storage capacitor CST may be connected between the first node N1 and the fifth node N5. The storage capacitor CST maintains the voltage level on the gate electrode of the first transistor TR1 during the deactivation time interval of the scan signal GW. The deactivation time interval of the scan signal GW may include (e.g., overlap with) the activation time interval of an emission control signal EM. The driving current ID generated by the first transistor TR1 may be applied to the OLED during the activation time interval of the emission control signal EM.

The fourth transistor TR4 may include a gate electrode receiving a data initialization signal GI, a source electrode connected to the fifth node N5, and a drain electrode connected to the sixth node N6. The fourth transistor TR4 may provide the negative power supply voltage ELVSS corresponding to the above-mentioned initialization voltage VINT to the gate electrode of the first transistor TR1 during the activation time interval of the data initialization signal GI. In other words, the fourth transistor TR4 may initialize the gate electrode of the first transistor TR1 with the negative power supply voltage ELVSS during the activation time interval of the data initialization signal GI.

In one example embodiment, the data initialization signal GI may be identical to the scan signal GW advanced by one horizontal time. For example, the data initialization signal GI is applied to pixels located in the (n)th row, and the data initialization signal GI may be substantially the same as the scan signal GW applied to pixels located in the (n−1)th row. Thus, the data initialization signal GI that is activated may be applied to pixels located in the (n)th row by applying the scan signal GW that is activated to pixels located in the (n−1)th row. As a result, the gate electrode of the first transistor TR1 included in pixels located in the (n)th row may be initialized as the initialization voltage VINT when the data signal DATA is applied pixels located in the (n−1)th row.

The fifth transistor TR5 may include a gate electrode receiving the emission control signal EM, a source electrode connected to the first node N1 and a drain electrode connected to the second node N2. The fifth transistor TR5 may provide the positive power supply voltage ELVDD to the second node N2 during the activation time interval of the emission control signal EM. In addition, the fifth transistor TR5 may disconnect the second node N2 from the power supply voltage ELVDD during the deactivation time interval of the emission control signal EM. The first transistor TR1 may generate the driving current ID while the fifth transistor TR5 provides the power supply, voltage ELVDD to the second node N2 during the activation time interval of the emission control signal EM. In addition, the data signal DATA compensated with the threshold voltage of the first transistor TR1 may be provided to the gate electrode of the first transistor TR1 while the fifth transistor TR5 disconnects the second node N2 from the power supply voltage ELVDD during the deactivation time interval of the emission control signal EM.

The sixth transistor TR6 may include a gate electrode receiving the emission control signal EM, a source electrode connected to the third node N3 and a drain electrode connected to the fourth node N4. The sixth transistor TR6 may provide the driving current ID generated by the first transistor TR1 to the OLED during the activation time interval of the emission control signal EM. In this case, the sixth transistor TR6 may operate in the linear region. In another embodiment, the sixth transistor TR6 operates in the saturation region. The sixth transistor TR6 may disconnect the first transistor TR1 from the OLED while the emission signal EM is deactivated such that the compensated data signal DATA applied to the second electrode of the first transistor TR1 is applied to the gate electrode of the first transistor TR1.

The seventh transistor TR7 may include a gate electrode receiving a diode initialization signal GB, a source electrode connected to the sixth node N6 and a drain electrode connected to the fourth node N4. The seventh transistor TR7 may provide the negative power supply voltage ELVSS to the anode of the OLED during the activation time interval of the diode initialization signal GB. In other words, the seventh transistor TR7 may initialize the anode of the OLED with the negative power supply voltage ELVSS during the activation time interval of the diode initialization signal GB.

In some example embodiments, the diode initialization signal GB may be the same as the data initialization signal GI. The initialization of the gate electrode of the first transistor TR1 and the initialization of the anode of the OLED may not affect each other, that is, they may be independent of each other. Thus the diode initialization signal GB and the data initialization signal GI may be combined as one signal. In addition, the initialization voltage VINT may be replaced with the negative power supply voltage ELVSS to simplify the manufacturing processes and enhance production efficiency.

Figure 15A:
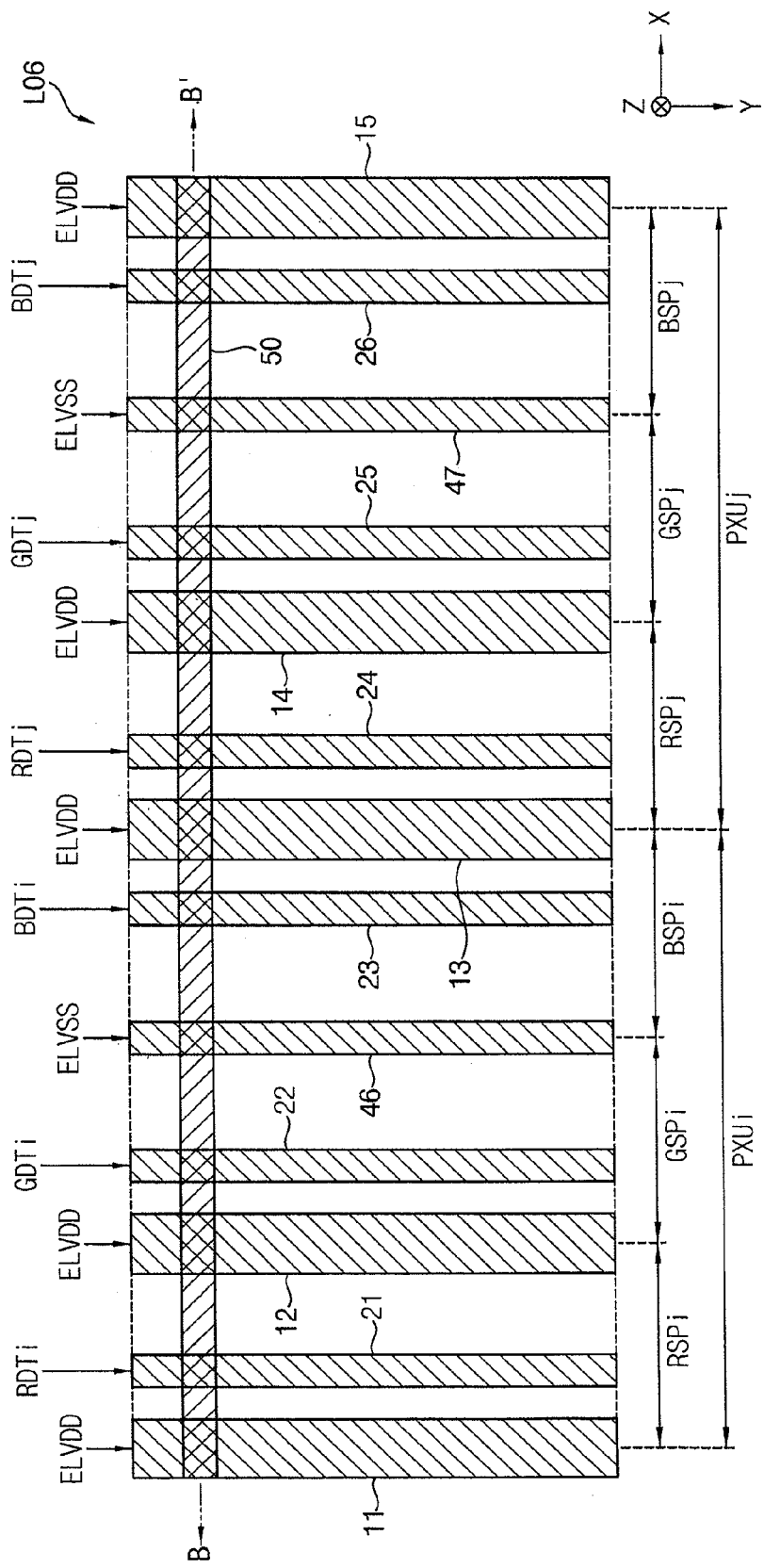
FIGS. 15A and 15B are diagrams illustrating a layout of voltage lines according to still another example embodiment of the present invention.
Figure 15B:
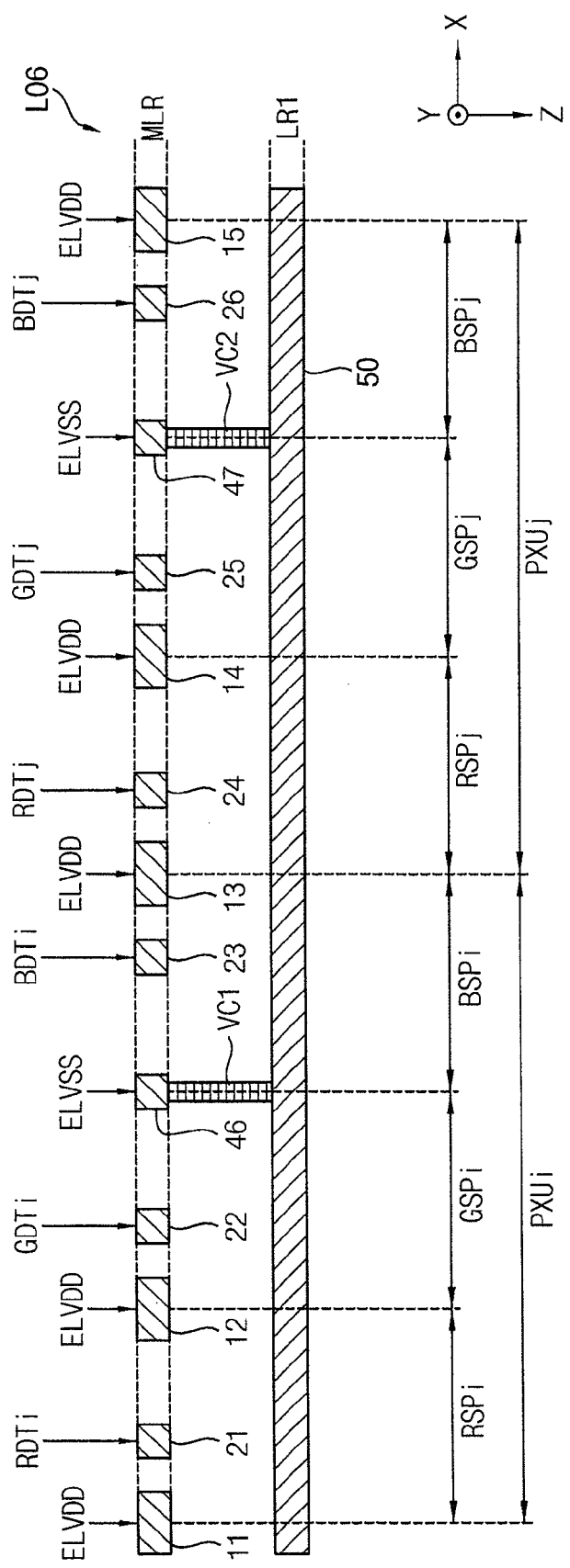

FIGS. 15A and 15B are diagrams illustrating a layout of voltage lines according to still another example embodiment of the present invention. Two pixel units PXUi and PXUj adjacent in the row direction X are illustrated in FIGS. 15A and 15B. FIG. 15B is a cross-sectional view at a line B-B' in FIG. 15A. Data lines 21, 22, 23, 24, 25, and 26 are illustrated in addition to voltage lines in FIGS. 15A and 15B.

For example, as illustrated in FIGS. 15A and 15B, the pixel units PXUi and PXUj may include red sub pixels RSPi and RSPj, green sub pixels GSPi and GSPj, and blue sub pixels BSPi and BSPj, respectively. The arrangement order of the R, G, and B sub pixels in each pixel unit may be changed. The sub pixels RSPi, GSPi, BSPi, RSPj, GSPj, and BSPj may receive data signals RDTi, GDTi, BDTi, RDTj, GDTj, and BDTj through the data lines 21, 22, 23, 24, 25, and 26, respectively.

Referring to FIGS. 15A and 15B, a layout LO6 of voltage lines may include a plurality of positive voltage lines 11, 12, 13, 14, and 15, and a plurality of initialization voltage lines 46 and 47. The patterns identical to that of FIGS. 15A and 15B are repeated along the row direction X and along the column direction Y.

The positive voltage lines 11, 12, 13, 14, and 15 are formed in a first metal layer MLR to provide the positive power supply voltage ELVDD to the pixel units. The positive voltage lines 11, 12, 13, 14, and 15 extend along the column direction Y and are arranged (e.g., arranged repeatedly or spaced apart from on another) along the row direction X. The initialization voltage lines 46 and 47 are formed in the first metal layer MLR to provide the negative power supply voltage ELVSS as the above-mentioned initialization voltage VINT to the pixel units. The initialization voltage lines 46 and 47 are extended in the column direction Y and arranged (e.g., arranged repeatedly or spaced apart from one another) along the row direction X.

The initialization lines 46 and 47 may be connected to a line 50 through vertical contacts VC1 and VC2, where the line 50 is formed in a conduction layer LR1 below the first metal layer MLR and extended along the row direction X. The initialization voltage VINT, for example, the negative power supply voltage ELVSS may be provided to the sub pixels RSPi, GSPi, BSPi, RSPj, GSPj, and BSPj arranged in the row direction X uniformly using the line 50 extended in the row direction X.

As illustrated in FIGS. 15A and 15B, the initialization voltage VINT may be equal to the negative power supply voltage ELVSS, and the initialization voltage lines 46 and 47 may be connected to the ring-shaped edge negative voltage lines as described with reference to FIGS. 3A, 3B, 4A, 4B, 5A, and 5B, so that the initialization voltage lines 46 and 47 may replace the compensation negative voltage lines.

Figure 16:
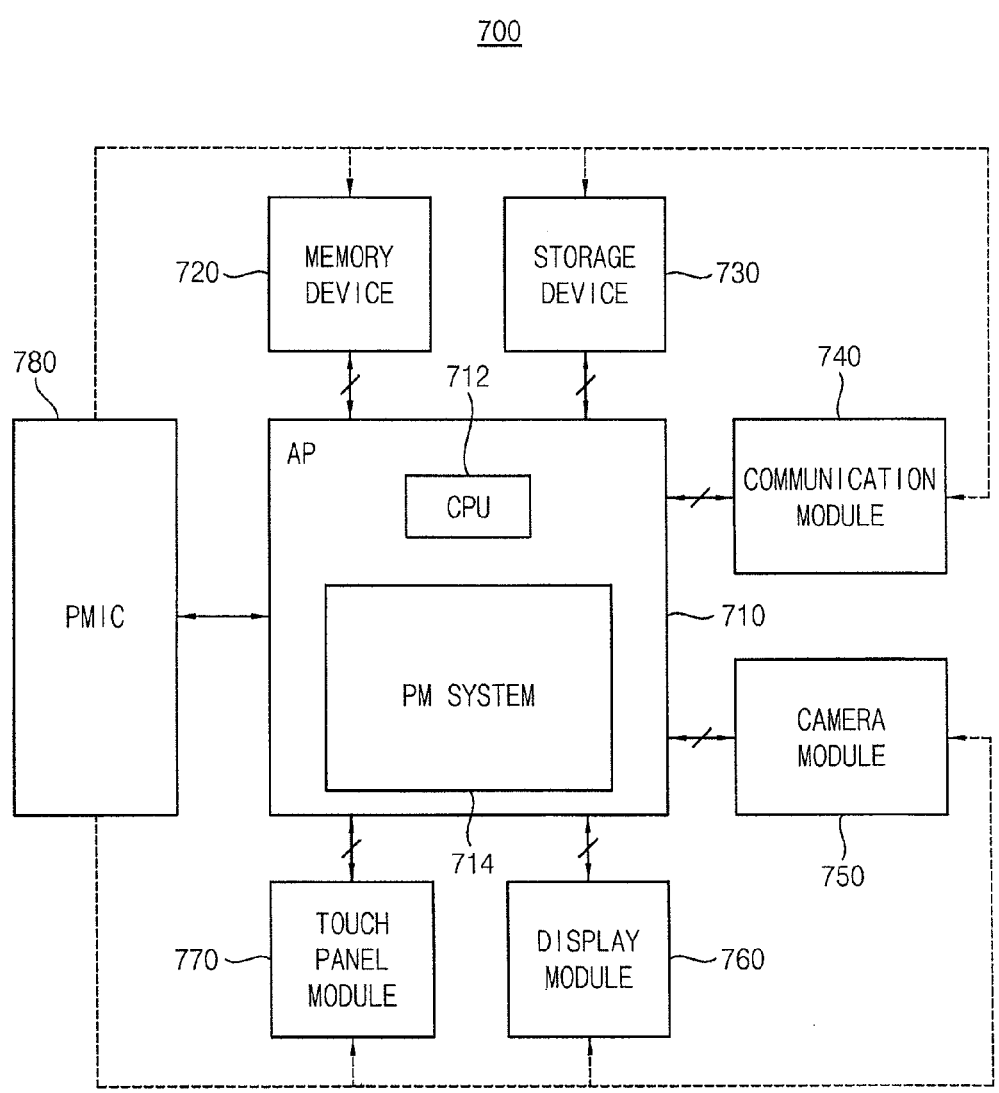
FIG. 16 is a block diagram illustrating a mobile device according to example embodiments of the present invention.

FIG. 16 is a block diagram illustrating a mobile device according to example embodiments of the present invention.

Referring to FIG. 16, a mobile device 700 includes a system on chip 710 and a plurality of functional modules 740, 750, 760, and 770. The mobile device 700 may further include a memory device 720, a storage device 730, and a power management integrated circuit (PMIC) 780.

The system on chip 710 controls overall operations of the mobile device 700. The system on chip 710 may control the memory device 720, the storage device 730, and the functional modules 740, 750, 760, and 770. For example, the system on chip 710 may be an application processor (AP). The system on chip 710 may include a CPU core 711 and a power management (PM) system 714.

The memory device 720 and the storage device 730 may store data for operations of the mobile device 700. The memory device 720 may correspond to a volatile semiconductor memory device such as a dynamic random access memory (DRAM) device, a static random access memory (SRAM) device, a mobile DRAM, etc. In addition, the storage device 730 may correspond to a non-volatile semiconductor memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. In some embodiments, the storage device 730 may correspond to a solid state drive (SSD) device, a hard disk drive (HDD) device, a CD-ROM device, etc.

The functional modules 740, 750, 760, and 770 perform various functions of the mobile device 700. For example, the mobile device 700 may comprise a communication module 740 that performs a communication function (e.g., a code division multiple access (CDMA) module, a long term evolution (LTE) module, a radio frequency (RF) module, an ultra wideband (UWB) module, a wireless local area network (WLAN) module, a worldwide interoperability for a microwave access (WIMAX) module, etc.), a camera module 750 that performs a camera function, a display module 760 that performs a display function, a touch panel module 770 that performs a touch sensing function, etc. In some embodiments, the mobile device 700 further includes a global positioning system (GPS) module, a microphone (MIC) module, a speaker module, a gyroscope module, etc. However, the types or kinds of the functional modules 740, 750, 760, and 770 in the mobile device 700 are not limited thereto.

The PMIC 780 may provide driving voltages to the system on chip 710, the memory device 720, and the functional modules 740, 750, 760, and 770, respectively.

According to example embodiments, the display module 760 includes a display panel and the display panel includes a cathode electrode, a ring-shaped edge negative voltage line, and a plurality of compensation negative voltage lines. The cathode electrode is formed in a cathode region such that the cathode electrode may cover an entire active region in which a plurality of pixel units are formed. The ring-shaped edge negative voltage line is formed in a ring-shaped edge portion of the cathode electrode to drive a negative power supply voltage to the cathode electrode. The compensation negative voltage lines are connected to the ring-shaped edge negative voltage line. The compensation negative voltage lines are extended in a column direction and arranged (e.g., arranged repeatedly or spaced apart from one another) along a row direction.

Figure 17:
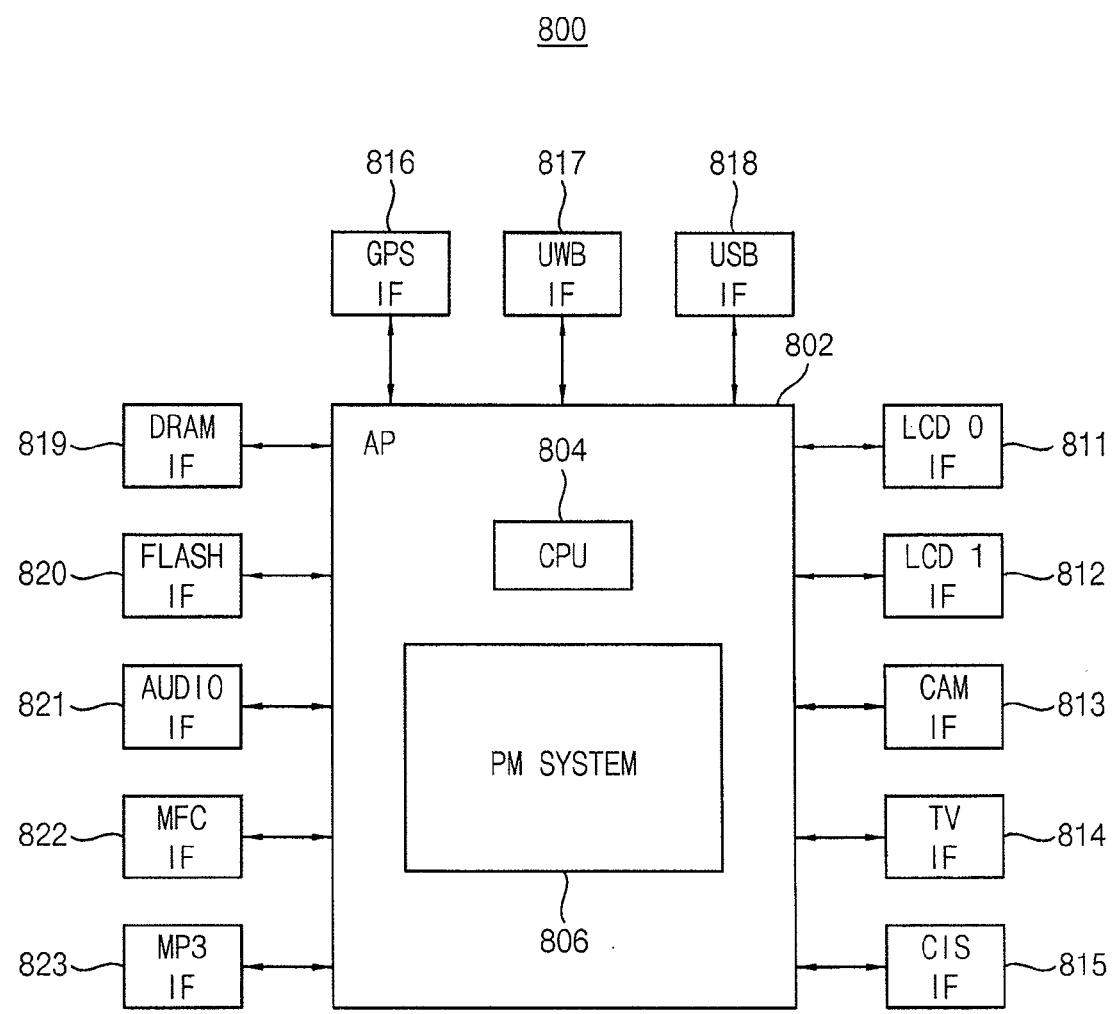
FIG. 17 is a block diagram illustrating a mobile device adopting an example interface according to example embodiments of the present invention.

FIG. 17 is a block diagram illustrating a mobile device adopting an example interface according to example embodiments.

Referring to FIG. 17, a mobile device 800 may include a system on chip 802 and a plurality of interfaces 811, 812, 813, 814, 815, 816, 817, 818, 819, 820, 821, 822, and 823. According to example embodiments, the mobile device 800 may be a mobile phone, a smart phone, a personal digital assistant (PDA), a portable multimedia player (PMP), a digital camera, a music player, a portable game console, a navigation system, etc.

The system on chip 802 controls overall operations of the mobile device 800. The system on chip 802 may be an application processor (AP). The system on chip 802 may include a CPU core 804 and a power management (PM) system 806.

The system on chip 802 may communicate with each of a plurality of peripheral devices through each of a plurality of interfaces 811, 812, 813, 814, 815, 816, 817, 818, 819, 820, 821, 822, and 823. For example, each of the plurality of interfaces 811, 812, 813, 814, 815, 816, 817, 818, 819, 820, 821, 822, and 823 may transmit at least one control signal, which is output from a corresponding intellectual property (IP) among a plurality of IPs embodied in each of power domains, to each of the plurality of peripheral devices.

For example, the system on chip 802 may control a power state and an operation state of each display device through each display interface 811 and 812. The display device may be a liquid crystal display (LCD), a light emitting diode (LED) display, an organic light emitting diode (OLED) display or an active matrix organic light-emitting diode (AMOLED) display.

The system on chip 802 may control a power state and an operation state of a camcorder through a camcorder interface 813, control a power state and an operation state of a TV module through a TV interface 814, and control a power state and an operation state of a camera module or an image sensor module through an image sensor interface 815.

The system on chip 802 may control a power state and an operation state of a GPS module through a GPS interface 816, control a power state and an operation state of an ultra wide-band (UWB) module through a UWB interface 817, and control a power state and an operation state of a USB drive through a USB drive interface 818.

The system on chip 802 may control a power state and an operation state of a dynamic random access memory (DRAM) through a DRAM interface 819, control a power state and an operation state of a non-volatile memory device, e.g., a flash memory, through a non-volatile memory interface 820, e.g., a flash memory interface, control a power state and an operation state of an audio module through an audio interface 821, control a power state of a multi-format codec (MFC) through an MFC interface 822, and control a power state of an MP3 player through an MP3 player interface 823. Here, a module or an interface may be embodied in hardware or software.

Figure 18:
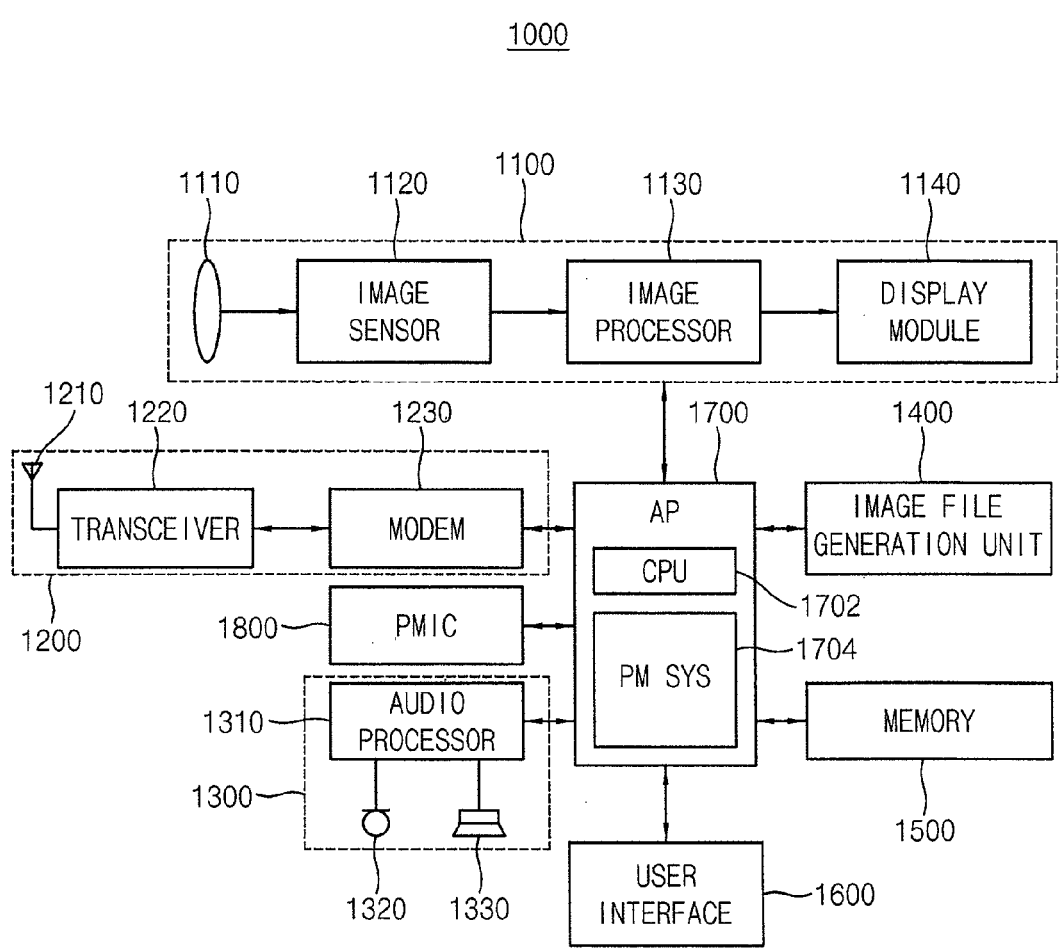
FIG. 18 is a block diagram illustrating a portable terminal according to example embodiments of the present invention.

FIG. 18 is a block diagram illustrating a portable terminal according to example embodiments of the present invention.

Referring to FIG. 18, a portable terminal 1000 includes an image processing block 1100, a wireless transceiving block 1200, an audio processing block 1300, an image file generation unit 1400, a memory device 1500, a user interface 1600, an application processor 1700, and a power management integrated circuit (PMIC) 1800.

The image processing block 1100 includes a lens 1110, an image sensor 1120, an image processor 1130, and a display module 1140. The wireless transceiving block 1200 includes an antenna 1210, a transceiver 1220, and a modem 1230. The audio processing block 1300 includes an audio processor 1310, a microphone 1320, and a speaker 1330.

According to example embodiments, the display module 1140 includes a display panel and the display panel includes a cathode electrode, a ring-shaped edge negative voltage line, and a plurality of compensation negative voltage lines. The cathode electrode is formed in a cathode region such that the cathode electrode may cover an entire active region in which a plurality of pixel units are formed. The ring-shaped edge negative voltage line is formed in a ring-shaped edge portion of the cathode electrode to drive a negative power supply voltage to the cathode electrode. The compensation negative voltage lines are connected to the ring-shaped edge negative voltage line. The compensation negative voltage lines are extended in a column direction and arranged (e.g., arranged repeatedly or spaced apart from one another) along a row direction.

The portable terminal 1000 may include various kinds of semiconductor devices. The application processor 1700 exhibits low power consumption and a high performance. The application processor 1700 has multiple cores as a manufacturing process has become minutely detailed. The application processor 1700 may include a CPU core 1702 and a power management (PM) system 1704.

The PMIC 1800 may provide driving voltages to the image processing block 1100, the wireless transceiving block 1200, the audio processing block 1300, the image file generation unit 1400, the memory device 1500, the user interface 1600, and the application processor 1700, respectively.

The above described embodiments may be applied to various kinds of devices and systems such as a mobile phone, a smart phone, a tablet computer, a laptop computer, a personal digital assistant PDA, a portable multimedia player PMP, a digital television, a digital camera, a portable game console, a music player, a camcorder, a video player, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and equivalents thereof.

What is claimed is:

1. A display panel comprising:
    a cathode electrode formed in a cathode region of the display panel, the cathode electrode entirely covering an active region of the display panel
    a plurality of pixel units in columns and rows in the active region of the display panel;
    a ring-shaped edge negative voltage line formed in a ring-shaped edge portion of the cathode electrode configured to supply a negative power supply voltage to the cathode electrode; and
    a plurality of compensation negative voltage lines connected to the ring-shaped edge negative voltage line, the compensation negative voltage lines extending along a column direction of the display panel and arranged along a row direction of the display panel.

2. The display panel of claim 1, further comprising:
    a plurality of positive voltage lines formed in a first metal layer configured to provide a positive power supply voltage to the pixel units, the positive voltage lines extending along the column direction and arranged along the row direction; and
    a plurality of initialization voltage lines formed in the first metal layer to provide an initialization voltage to the pixel units, the initialization voltage lines extending along the column direction and arranged along the row direction.

3. The display panel of claim 2, wherein the compensation negative voltage lines are formed in the first metal layer through the same manufacturing processes as the manufacturing processes of the positive voltage lines and the initialization voltage lines.

4. The display panel of claim 3, wherein the initialization voltage lines comprise one initialization voltage line per two columns of pixel units, and
    wherein the compensation negative voltage lines comprise one compensation negative voltage line per two columns of pixel units.

5. The display panel of claim 2, wherein the compensation negative voltage lines are formed in a second metal layer over the first metal layer through manufacturing processes separate from manufacturing processes of the positive voltage lines and the initialization voltage lines.

6. The display panel of claim 5, wherein the compensation negative voltage lines comprise two compensation negative voltage lines per column of pixel units, and
wherein the initialization voltage lines comprise one initialization voltage line per column of pixel units.

7. The display panel of claim 6, wherein each of the compensation negative voltage lines is over corresponding ones of the positive voltage lines such that two compensation negative voltage lines are arranged per one column of pixel units.

8. The display panel of claim 6, wherein each of the compensation negative voltage lines is over corresponding ones of the initialization voltage lines such that one compensation negative voltage lines is arranged per one column of pixel units.

9. The display panel of claim 6, wherein each of the compensation negative voltage lines is over corresponding ones of the positive voltage lines and each of the initialization voltage lines such that three compensation negative voltage lines are arranged per one column of pixel units.

10. The display panel of claim 2, wherein the compensation negative voltage lines are formed in an anode layer over the first metal layer through a manufacturing processes different from manufacturing processes of the positive voltage lines and the initialization voltage lines, anode electrodes of light-emitting diodes in the pixel units being formed in the anode layer.

11. The display panel of claim 1, further comprising:
a plurality of positive voltage lines formed in a first metal layer configured to provide a positive power supply voltage to the pixel units, the positive voltage lines extending along the column direction and arranged along the row direction, the positive voltage lines being formed through the same manufacturing process as the compensation negative voltage lines,
wherein the compensation negative voltage lines are further configured to supply an initialization voltage to the pixel units, the initialization voltage having a voltage equal to the negative power supply voltage.

12. The display panel of claim 11, wherein each of the compensation negative voltage lines is coupled to pixel units of a corresponding one of the columns.

13. The display panel of claim 1, wherein the ring-shaped edge negative voltage line and the compensation negative voltage lines are formed in a same metal layer.

14. The display panel of claim 13, wherein the ring-shaped' edge negative voltage line and the compensation negative voltage lines are patterned through the same manufacturing processes and are directly connected to each other.

15. The display panel of claim 1, wherein the ring-shaped edge negative voltage line and the compensation negative voltage lines are formed in different metal layers.

16. The display panel of claim 1, wherein the ring-shaped edge negative voltage line and the compensation negative voltage lines are connected to each other through a plurality of vertical contacts.

17. The display panel of claim 1, wherein the ring-shaped edge negative voltage line includes:
a top edge line along a top edge portion of the cathode electrode, the top edge line extending along the row direction;
a bottom edge line along a bottom edge portion of the cathode electrode, the bottom edge line extending along the row direction;
a left edge line along a left edge portion of the cathode electrode, the left edge line extending along the column direction; and
a right edge fine along a right edge portion of the cathode electrode, the right edge line extending along the column direction.

18. The display panel of claim 17, wherein the compensation negative voltage lines extending along the column direction are connected to the top edge line and the bottom edge line extending along the row direction.

19. A display module comprising:
a display panel; and
a driving circuit configured to drive the display panel,
the display panel comprising:
a cathode electrode in a cathode region of the display panel, the cathode electrode covering an entire active region in which a plurality of pixel units are located;
a ring-shaped edge negative voltage line in a ring-shaped edge portion of the cathode electrode configured to apply a negative power supply voltage to the cathode electrode; and
a plurality of compensation negative voltage lines connected to the ring-shaped edge negative voltage line, the compensation negative voltage lines extending along a column direction and arranged along a row direction.

20. A mobile device comprising:
an application processor;
a display panel; and
a driving circuit configured to be controlled by the application processor to drive the display panel,
the display panel comprising:
a cathode electrode in a cathode region of the display panel, the cathode electrode covering an entire active region in which a plurality of pixel units are located;
a ring-shaped edge negative voltage line formed in a ring-shaped edge portion of the cathode electrode configured to apply a negative power supply voltage to the cathode electrode; and
a plurality of compensation negative voltage lines connected to the ring-shaped edge negative voltage line, the compensation negative voltage lines extending along a column direction and arranged along a row direction.

* * * * *